(12) United States Patent
Sasaki

(10) Patent No.: US 12,464,838 B2
(45) Date of Patent: Nov. 4, 2025

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Kazuya Sasaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 438 days.

(21) Appl. No.: 17/626,236

(22) PCT Filed: Jul. 10, 2020

(86) PCT No.: PCT/JP2020/027048
§ 371 (c)(1),
(2) Date: Jan. 11, 2022

(87) PCT Pub. No.: WO2021/015009
PCT Pub. Date: Jan. 28, 2021

(65) Prior Publication Data
US 2022/0254819 A1    Aug. 11, 2022

(30) Foreign Application Priority Data

Jul. 24, 2019 (JP) ................. 2019-135930

(51) Int. Cl.
*H10F 39/00* (2025.01)
*H10F 39/18* (2025.01)

(52) U.S. Cl.
CPC ........... *H10F 39/802* (2025.01); *H10F 39/18* (2025.01); *H10F 39/8037* (2025.01)

(58) Field of Classification Search
CPC ..................... H01L 27/14614; H10F 39/80373
See application file for complete search history.

(56) References Cited

U.S. PATENT DOCUMENTS

2005/0040440 A1\* 2/2005 Murakami .......... H01L 27/1462
257/E27.152
2011/0042723 A1    2/2011 Mabuchi
(Continued)

FOREIGN PATENT DOCUMENTS

CN        103024295        4/2013
CN        105390513        3/2016
(Continued)

OTHER PUBLICATIONS

International Search Report prepared by the European Patent Office on Sep. 18, 2020, for International Application No. PCT/JP2020/027048, 4 pages.
(Continued)

*Primary Examiner* — Thanh Luu
(74) *Attorney, Agent, or Firm* — SHERIDAN ROSS P.C.

(57) ABSTRACT

A solid-state imaging device includes: a semiconductor substrate; a photoelectric converter having a predetermined dimension in a thickness direction of the semiconductor substrate; a first charge accumulator that is provided in the semiconductor substrate and accumulates a signal charge generated by the photoelectric converter; and a transfer gate including a first electrode section and a second electrode section, the first electrode section being embedded in the semiconductor substrate, having a first dimension in the thickness direction of the semiconductor substrate, and being provided on a side of the photoelectric converter, and the second electrode section being selectively provided at a position closer to the first charge accumulator than the first electrode section and having a second dimension in the thickness direction of the semiconductor substrate smaller than the first dimension.

19 Claims, 30 Drawing Sheets

(56) References Cited

U.S. PATENT DOCUMENTS

| | | |
|---|---|---|
| 2013/0076934 A1 | 3/2013 | Maeda |
| 2014/0197464 A1 | 7/2014 | Ihara |
| 2014/0252420 A1* | 9/2014 | Yi .................... H01L 27/1463 257/229 |
| 2015/0155328 A1 | 6/2015 | Park et al. |
| 2016/0005777 A1 | 1/2016 | Nakamura |
| 2016/0056199 A1* | 2/2016 | Kim .................... H04N 25/771 257/233 |
| 2018/0033816 A1* | 2/2018 | Fukuoka ........... H01L 27/14689 |
| 2018/0308889 A1 | 10/2018 | Takagi et al. |
| 2020/0035724 A1 | 1/2020 | Machida et al. |
| 2020/0135781 A1 | 4/2020 | Nakagawa |

FOREIGN PATENT DOCUMENTS

| | | | |
|---|---|---|---|
| EP | 3358621 | | 8/2018 |
| JP | 2010073840 A | | 4/2010 |
| JP | 2013069846 A | | 4/2013 |
| JP | 2015082592 A | | 4/2015 |
| JP | 2018-147975 | | 9/2018 |
| JP | 2018-190797 | | 11/2018 |
| JP | 2019057704 A | | 4/2019 |
| KR | 10-2006-0108017 | | 10/2006 |
| WO | WO-2017057278 A1 | | 4/2017 |
| WO | WO-2018198486 A1 * | 11/2018 | ........... H01L 27/146 |

OTHER PUBLICATIONS

Written Opinion prepared by the European Patent Office on Sep. 18, 2020, for International Application No. PCT/JP2020/027048, 7 pages.

Official Action for China Patent Application No. 202080051429.7, dated Jul. 19, 2025, 28 pages.

* cited by examiner

[Fig. 1]
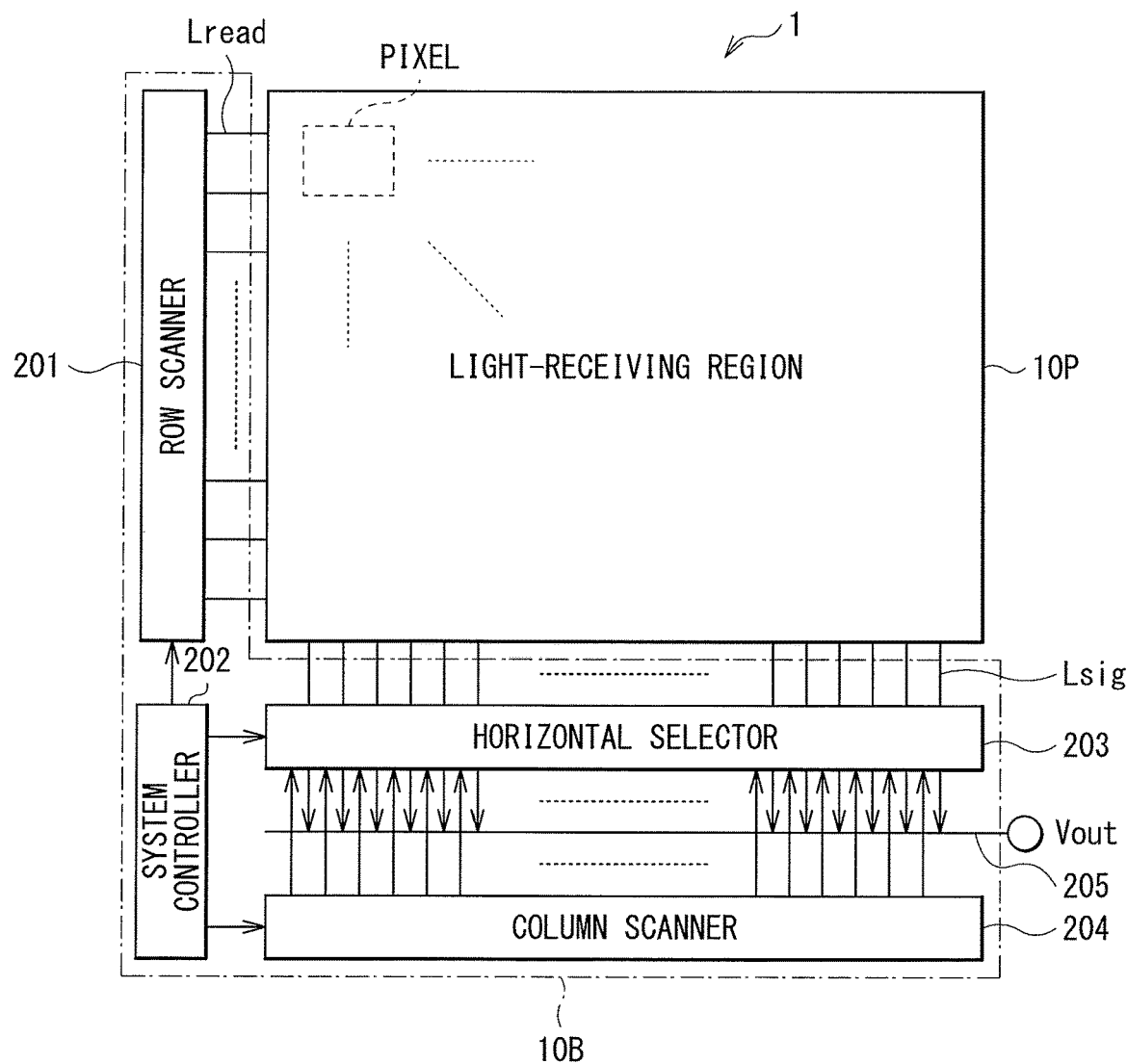

[Fig. 2]
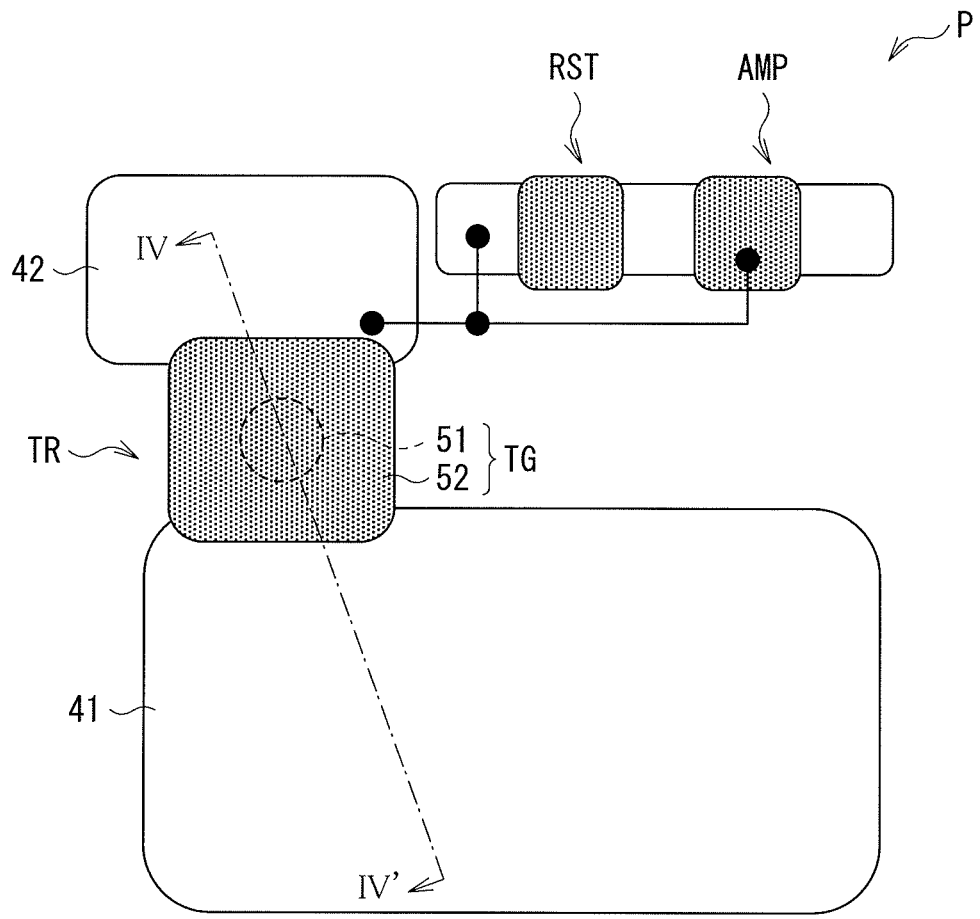
[Fig. 3]
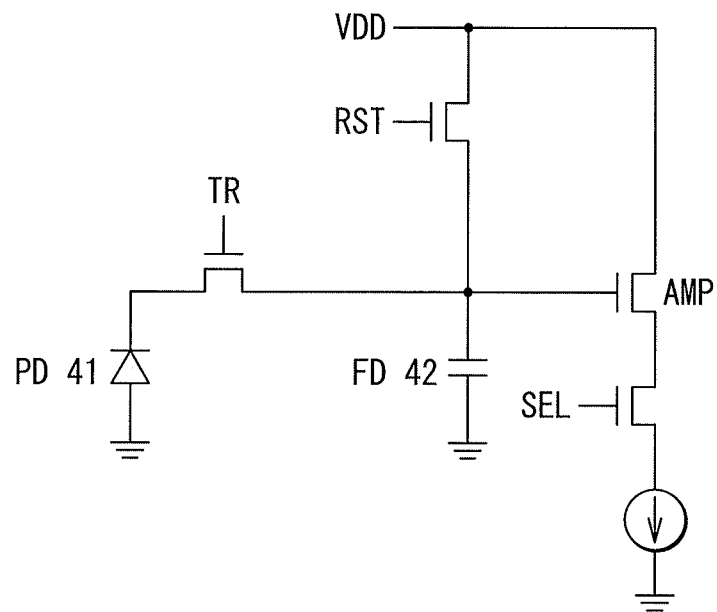

[Fig. 4]
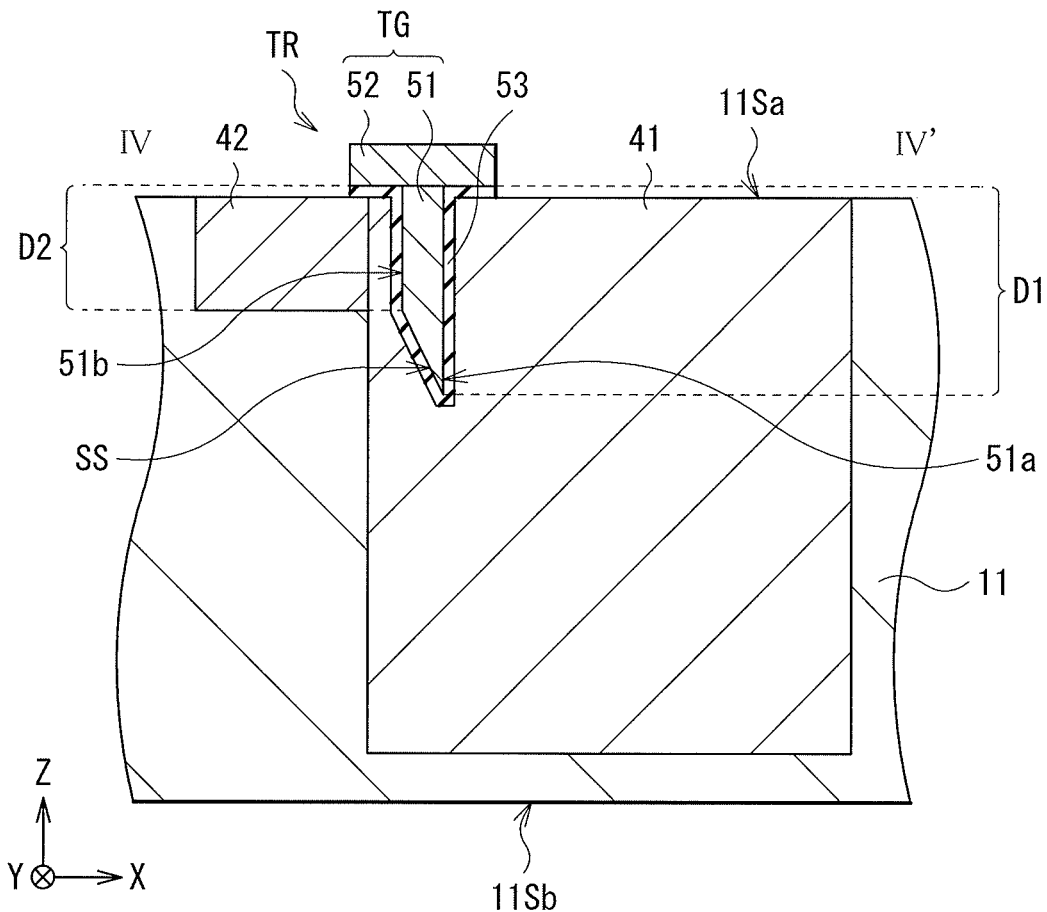
[Fig. 5]
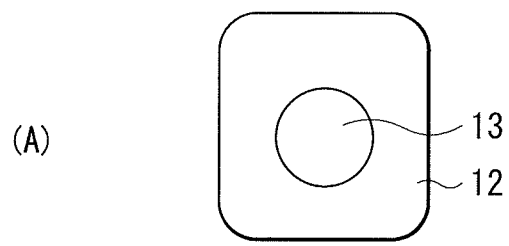
(A)
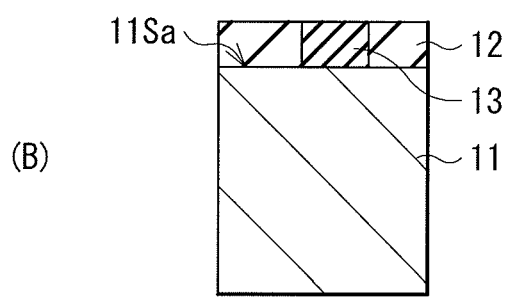
(B)

[Fig. 6]
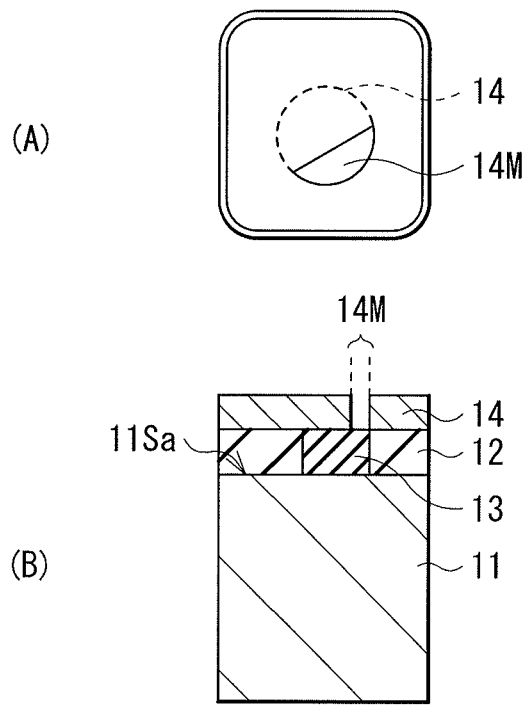
[Fig. 7]
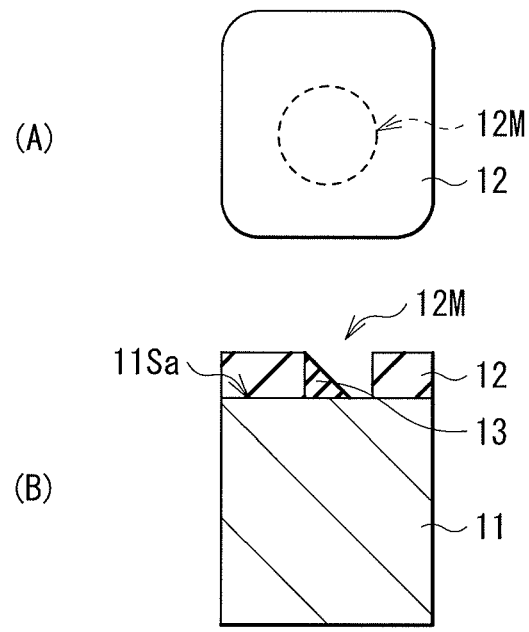

[Fig. 8]
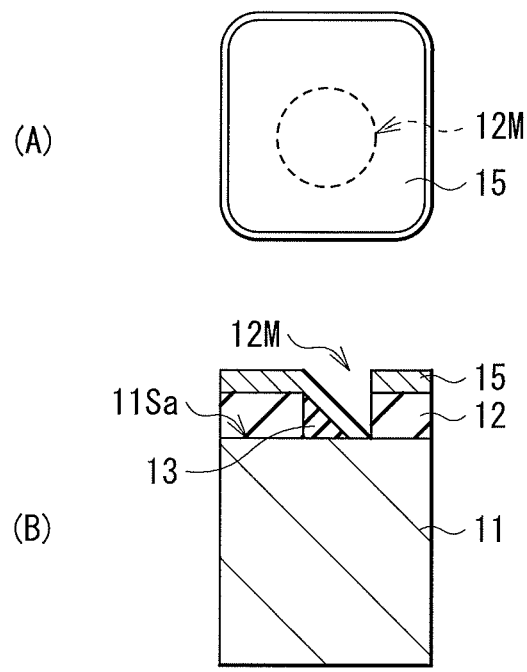
[Fig. 9]
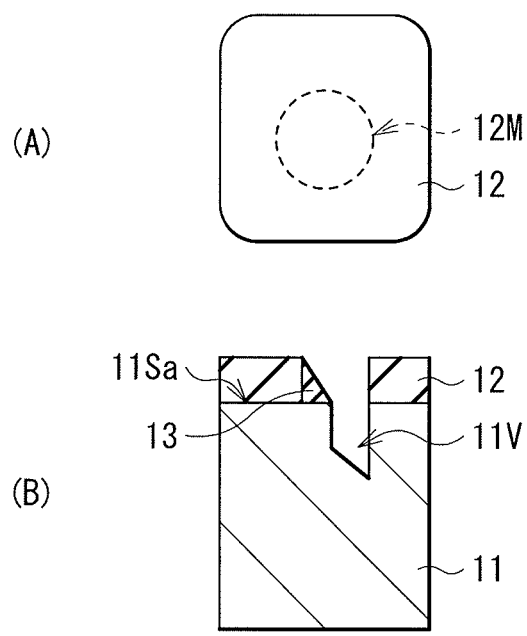

[Fig. 10]
(A)
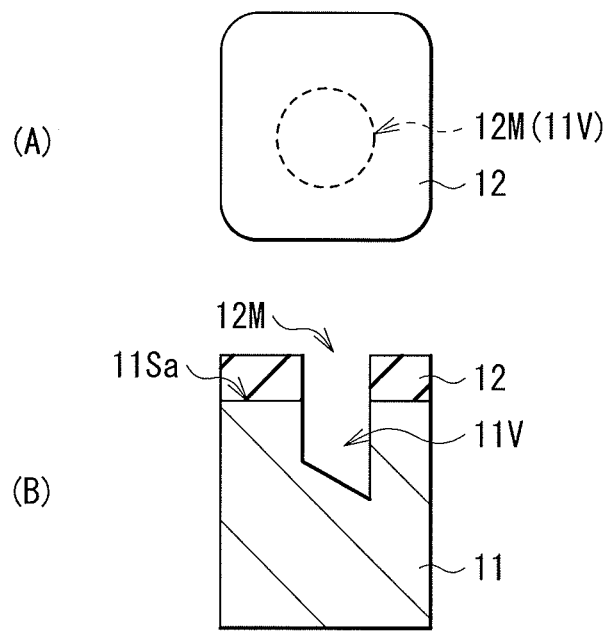
(B)
[Fig. 11]
(A)
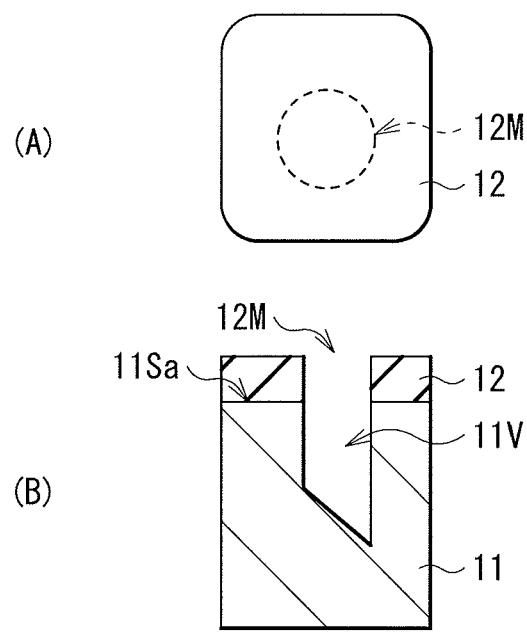
(B)

[Fig. 12]
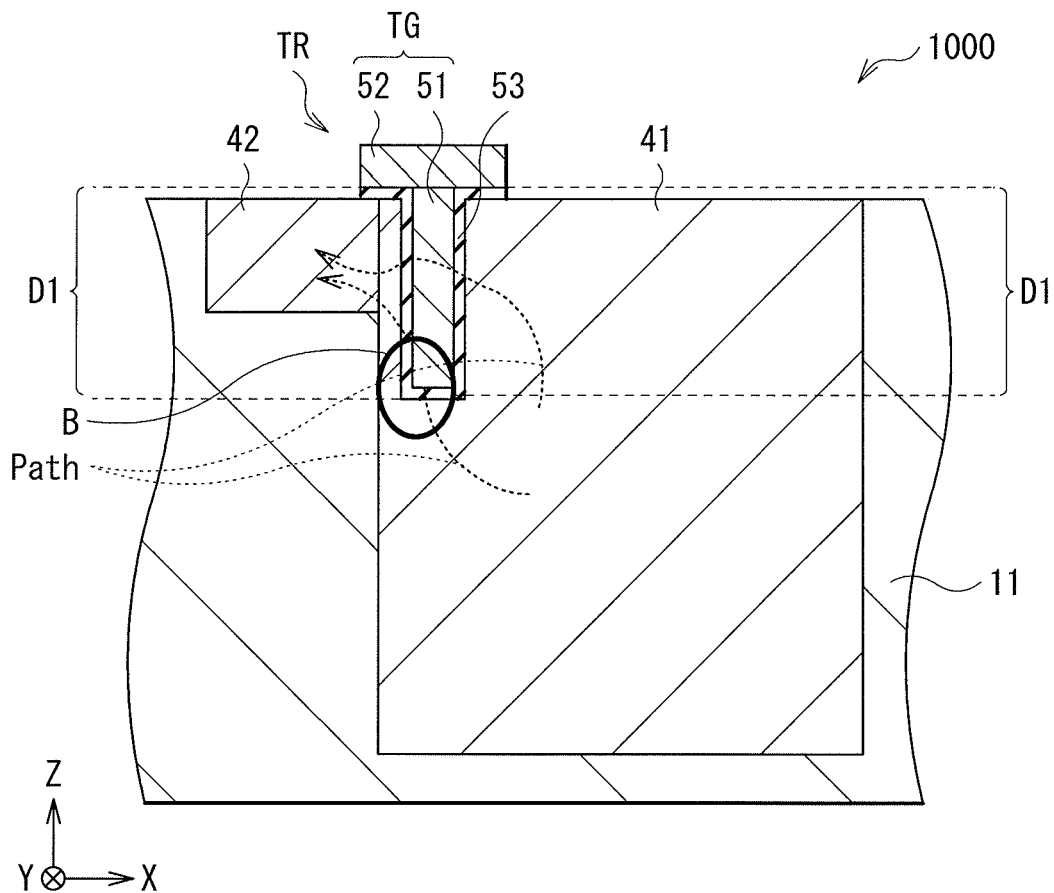
[Fig. 13A]
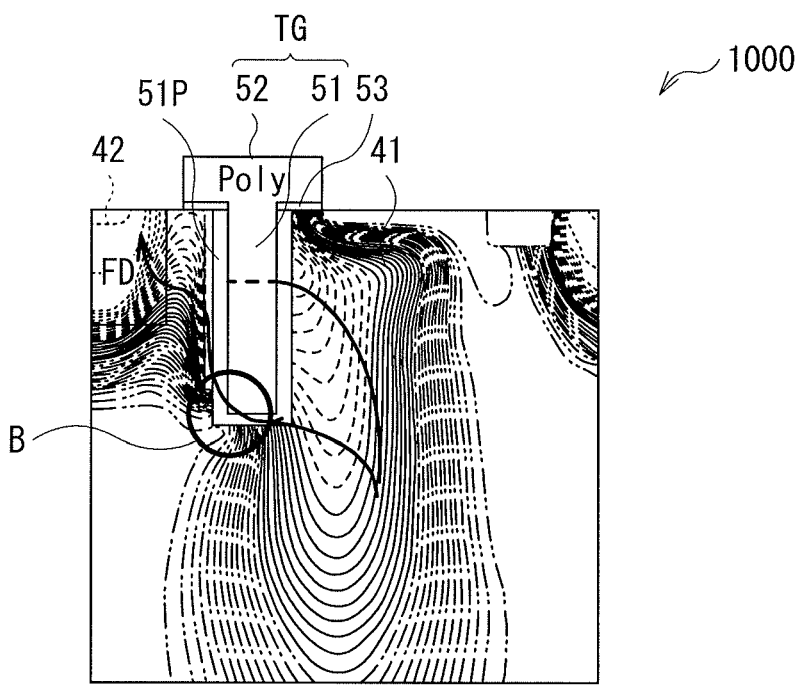

[Fig. 13B]
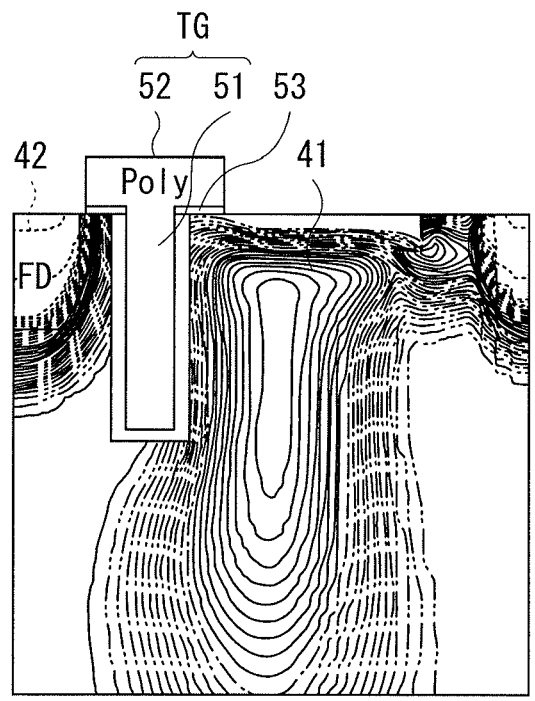
[Fig. 14]
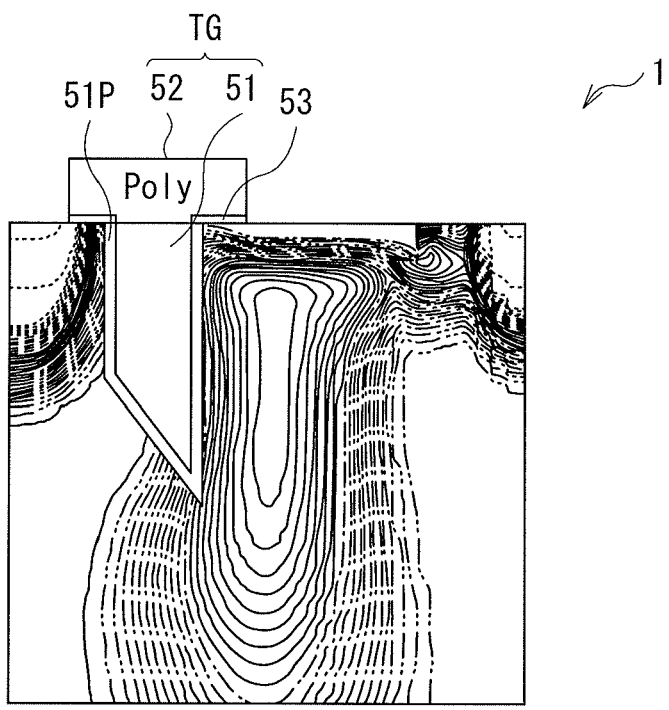

[Fig. 15]
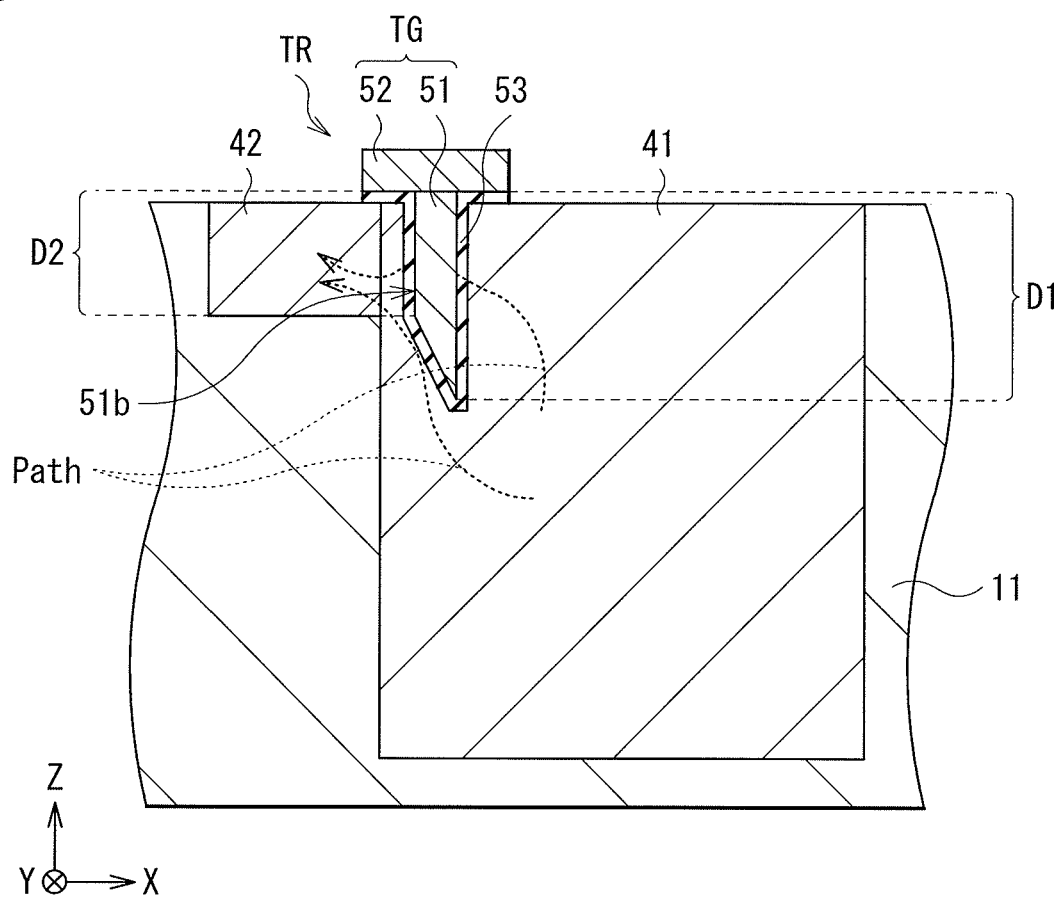
[Fig. 16]
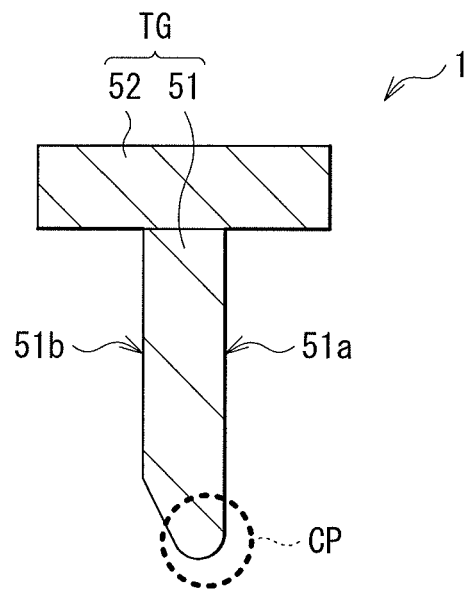

[Fig. 17]
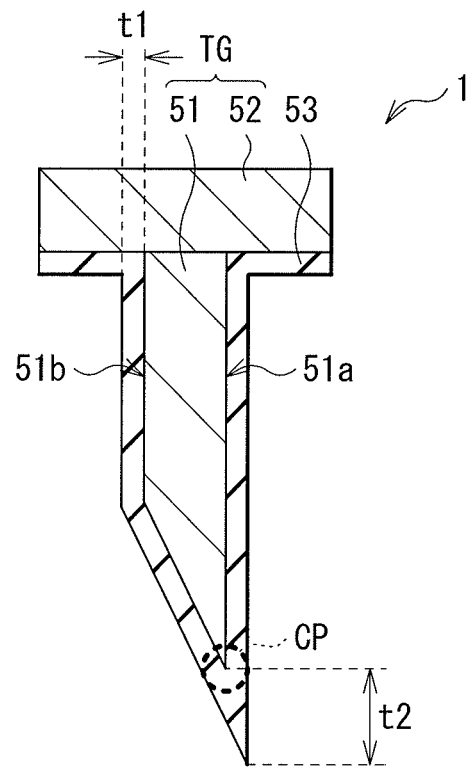
[Fig. 18]
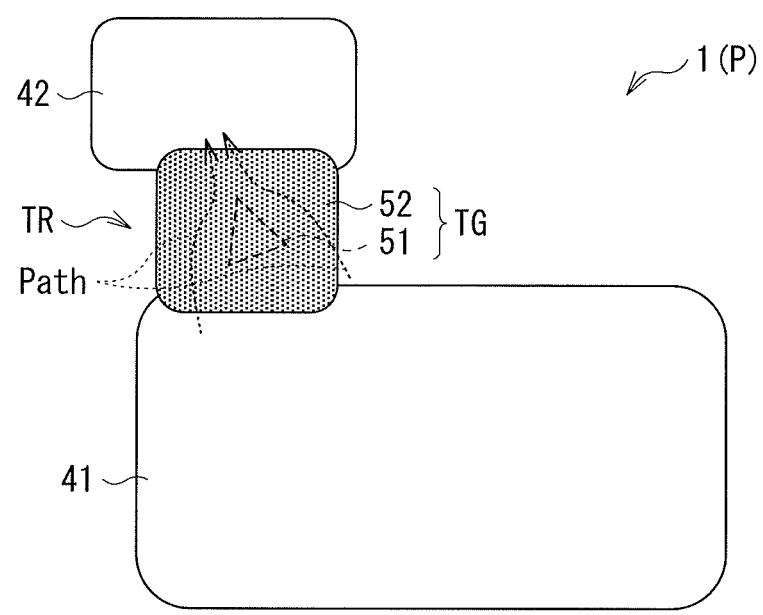

[Fig. 19]
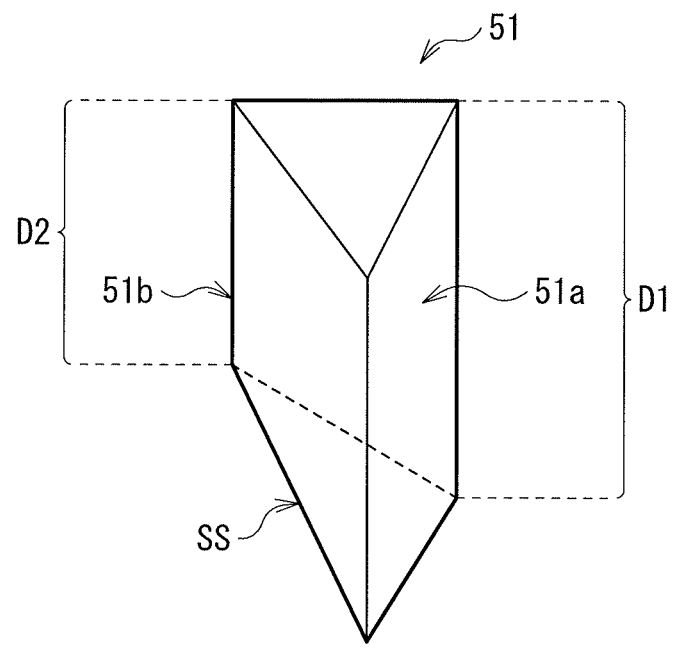
[Fig. 20]
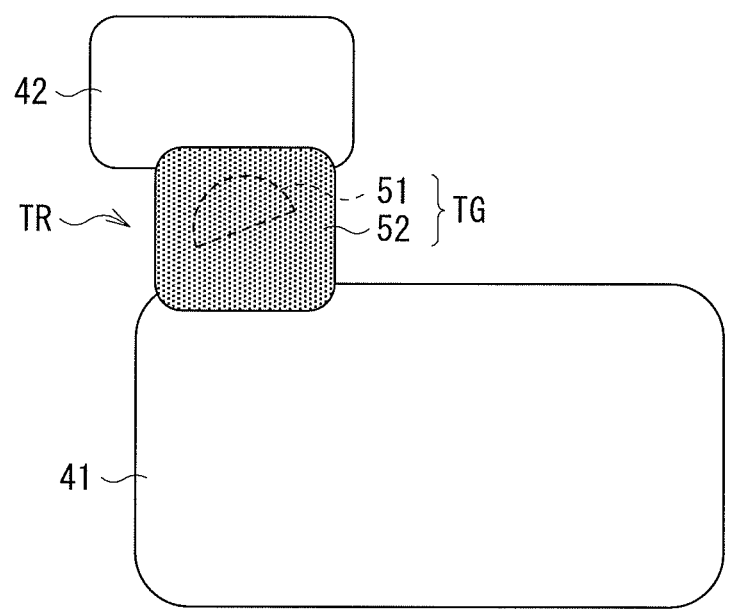

[Fig. 21]
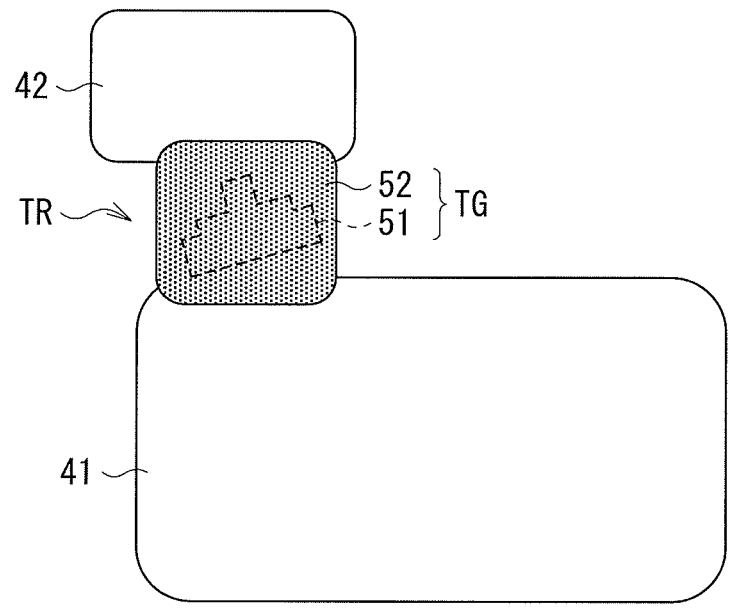
[Fig. 22]
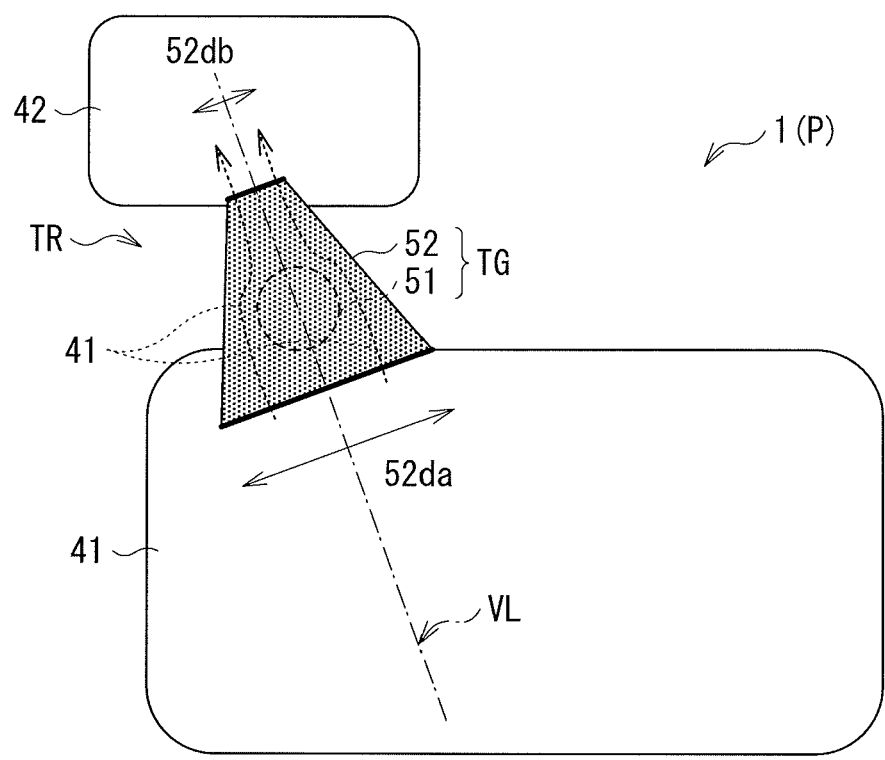

[Fig. 23A]
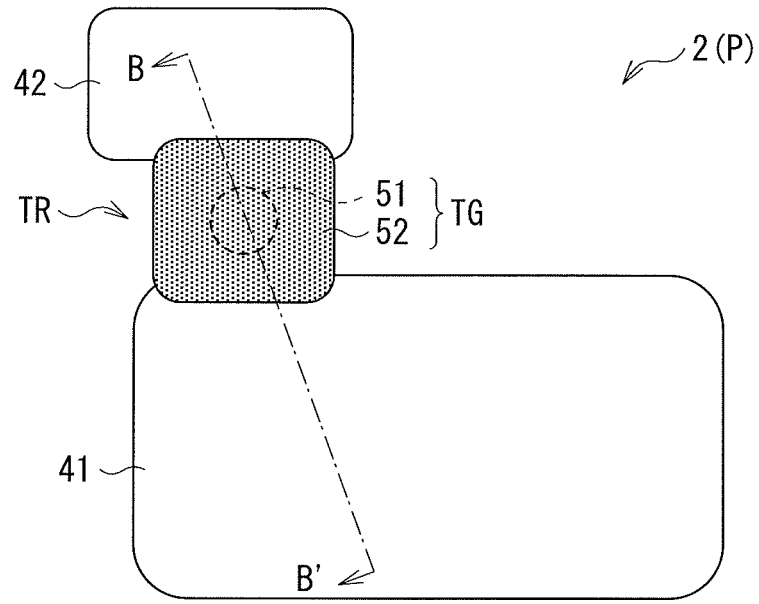
[Fig. 23B]
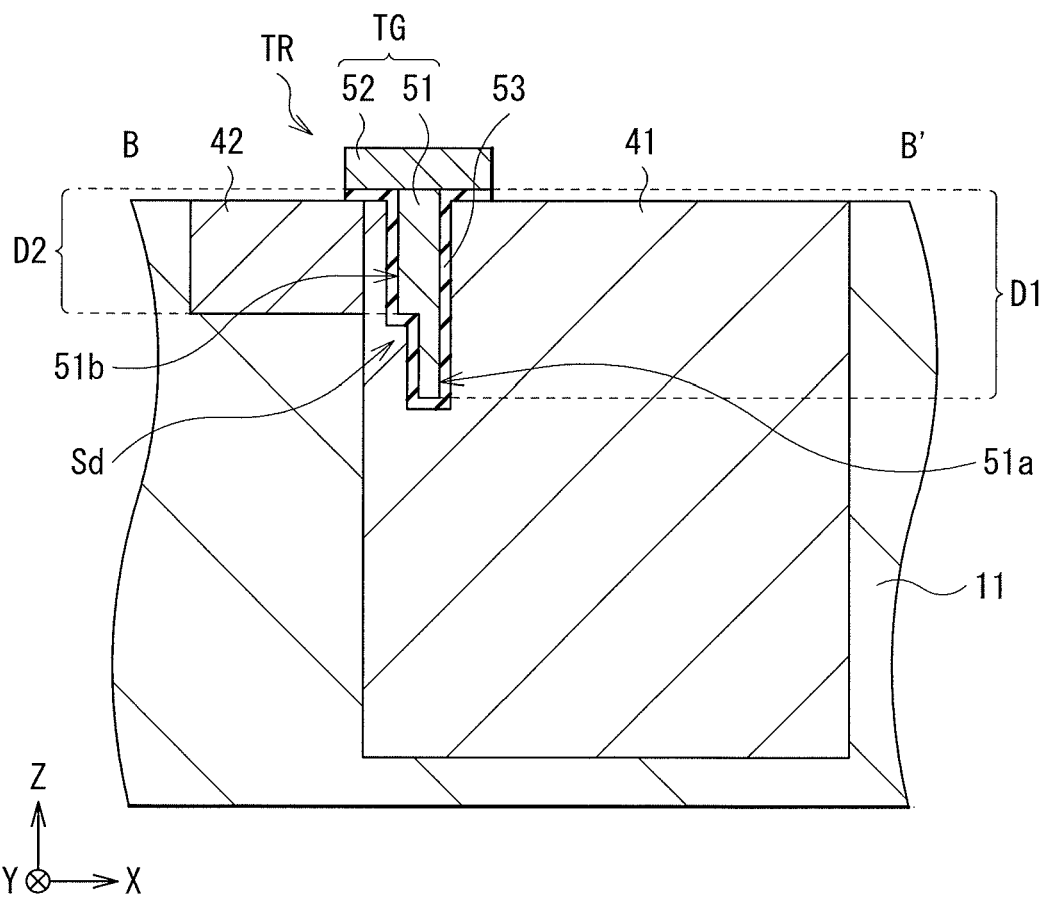

[Fig. 24]
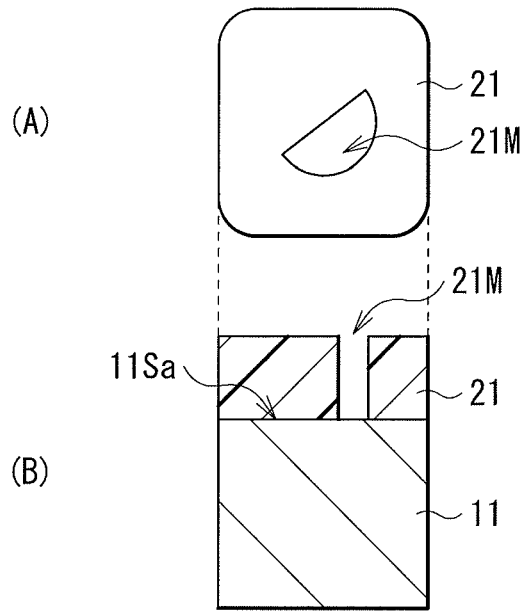
[Fig. 25]
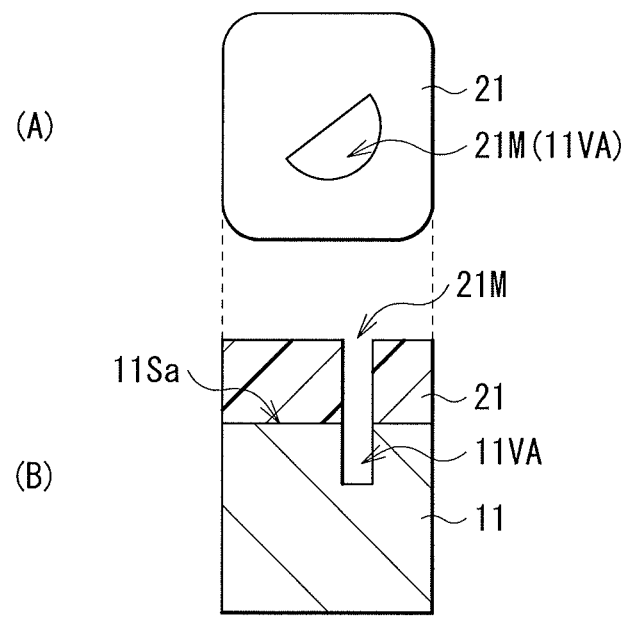

[Fig. 26]
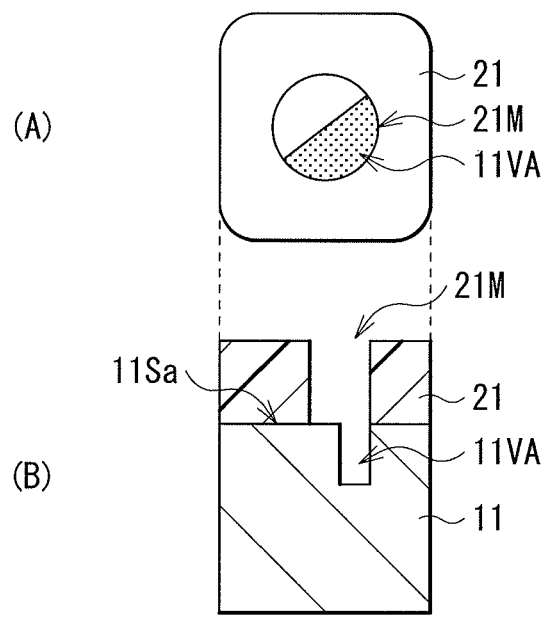
[Fig. 27]
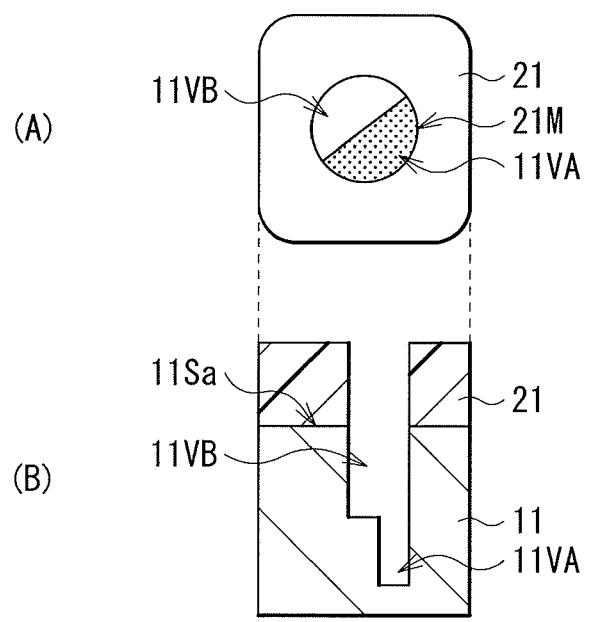

[Fig. 28]
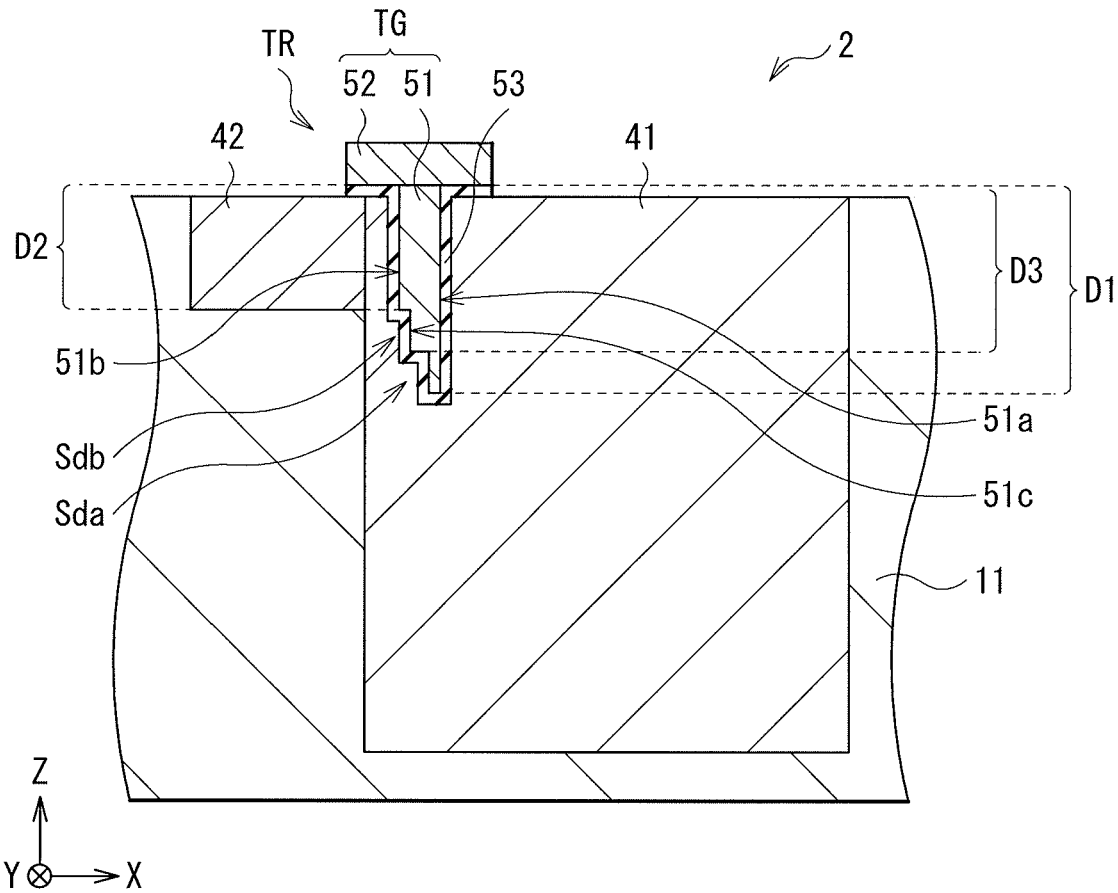
[Fig. 29A]
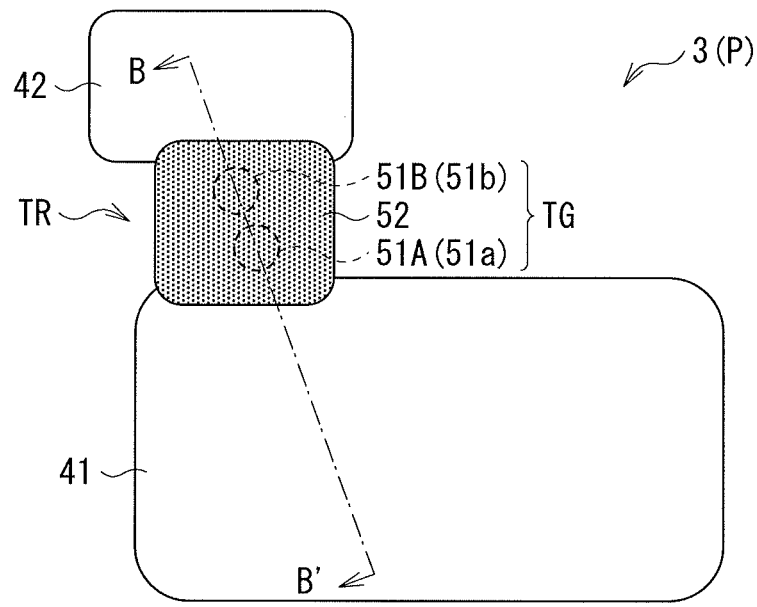

[Fig. 29B]
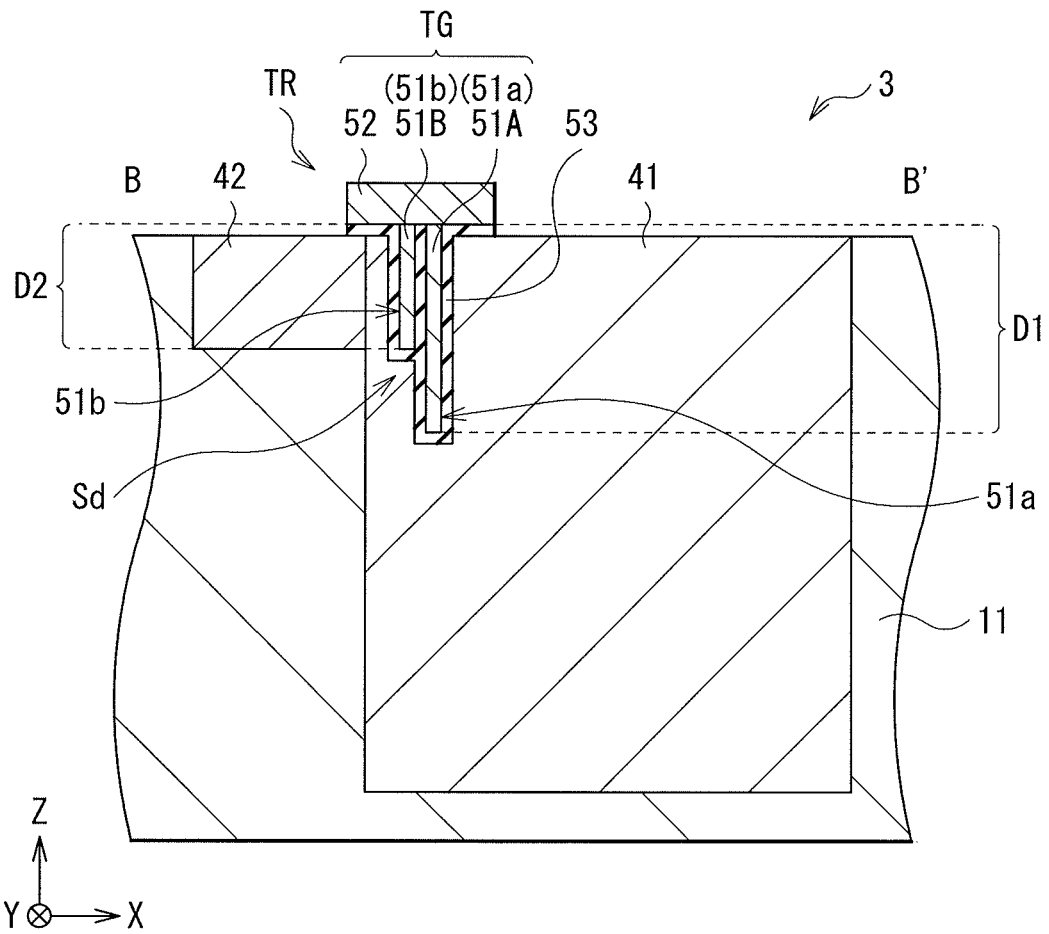
[Fig. 30]
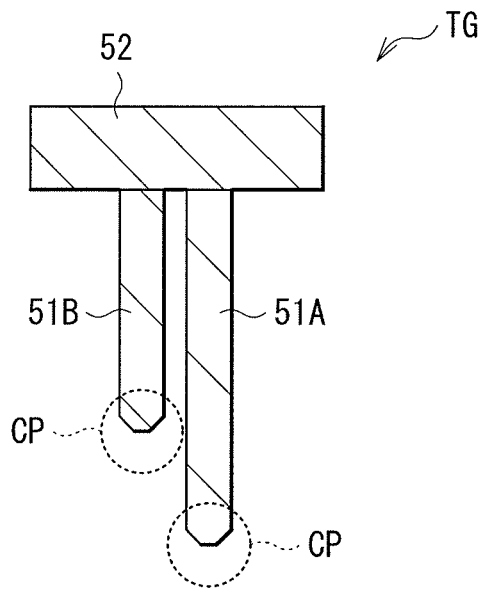

[Fig. 31]
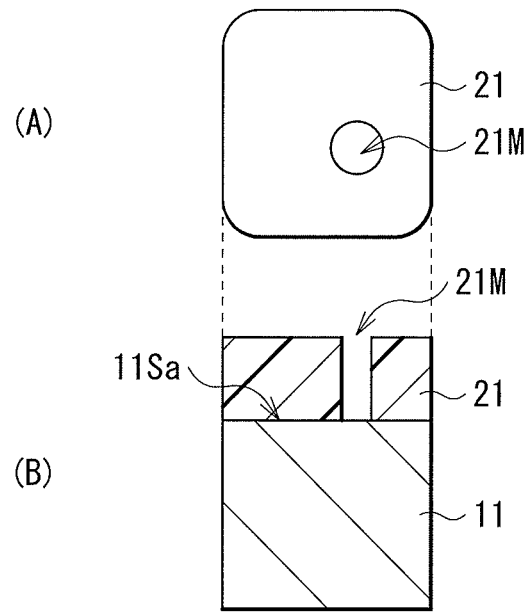
[Fig. 32]
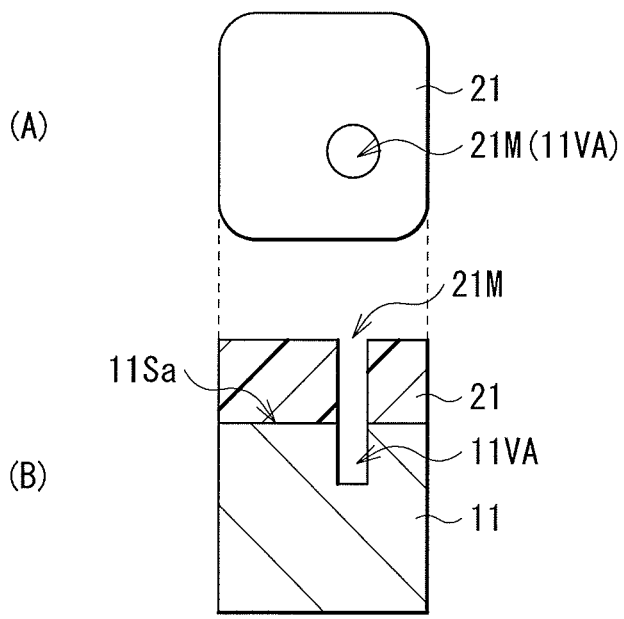

[Fig. 33]
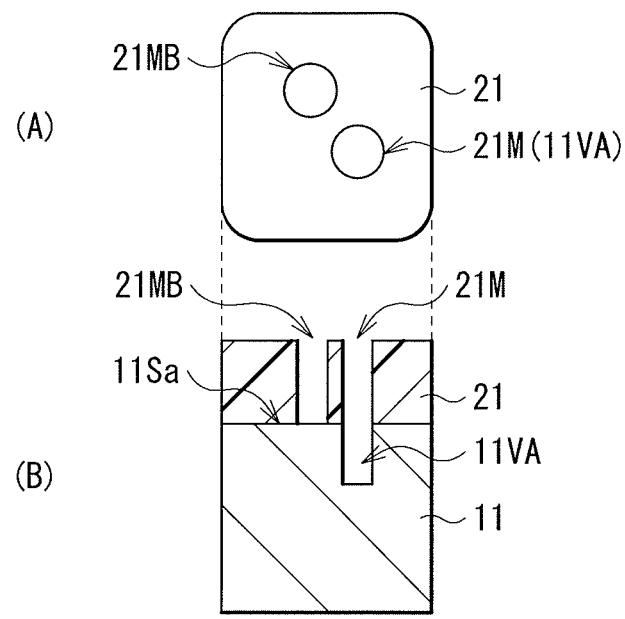
[Fig. 34]
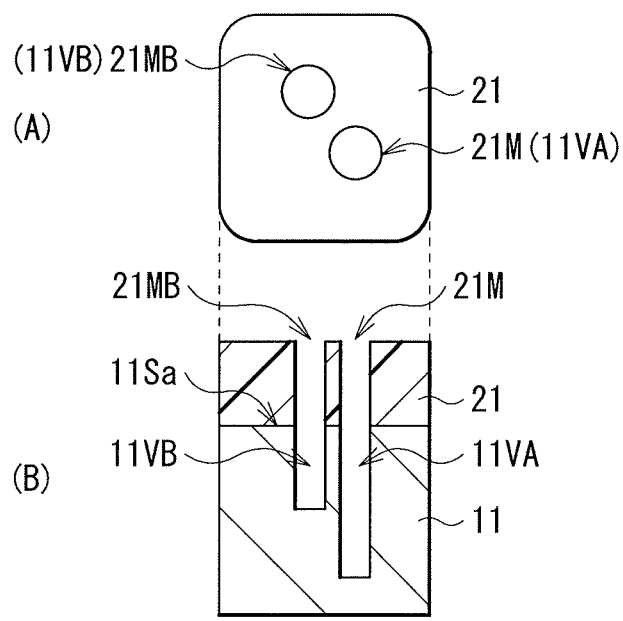

[Fig. 35A]
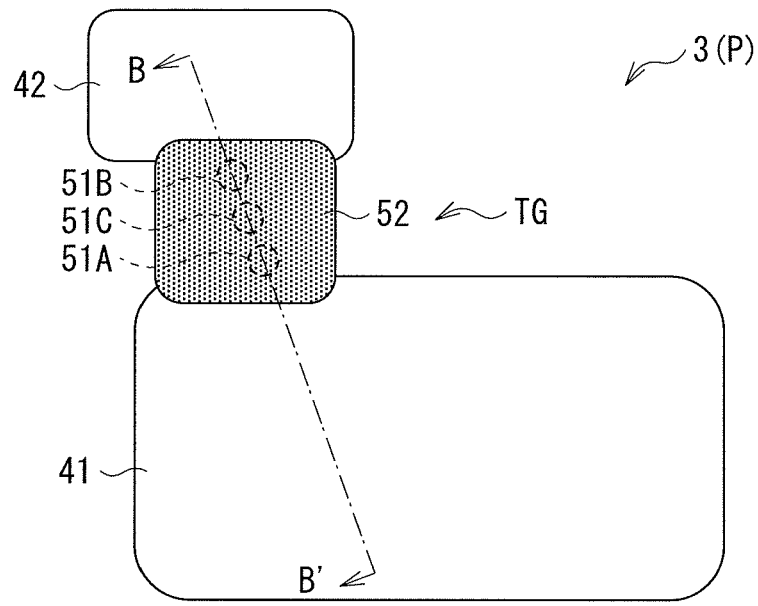
[Fig. 35B]
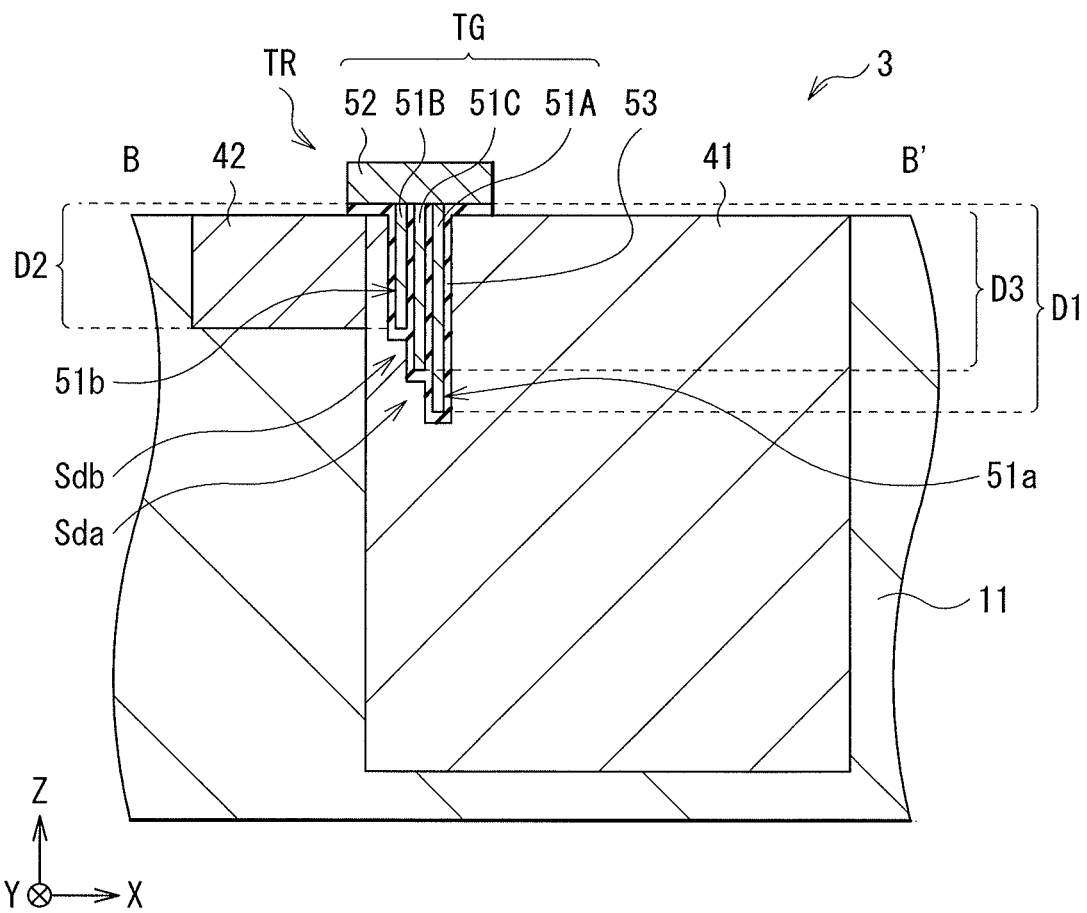

[Fig. 36A]
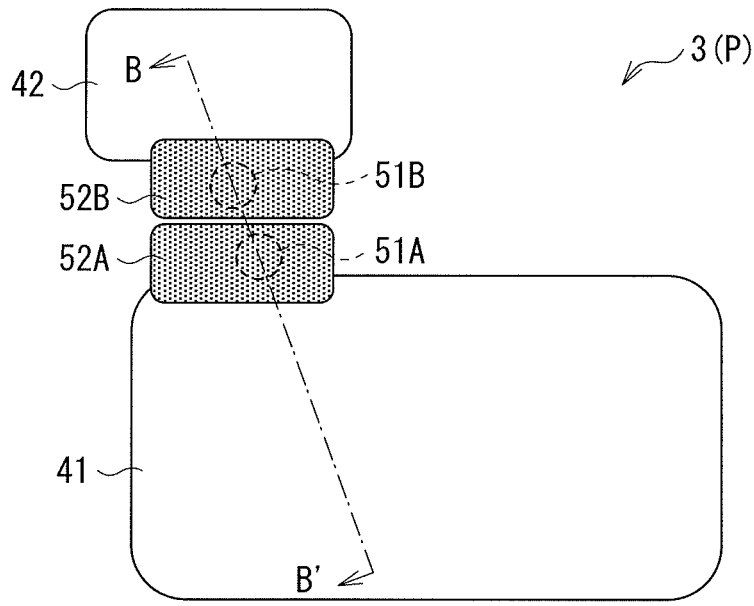
[Fig. 36B]
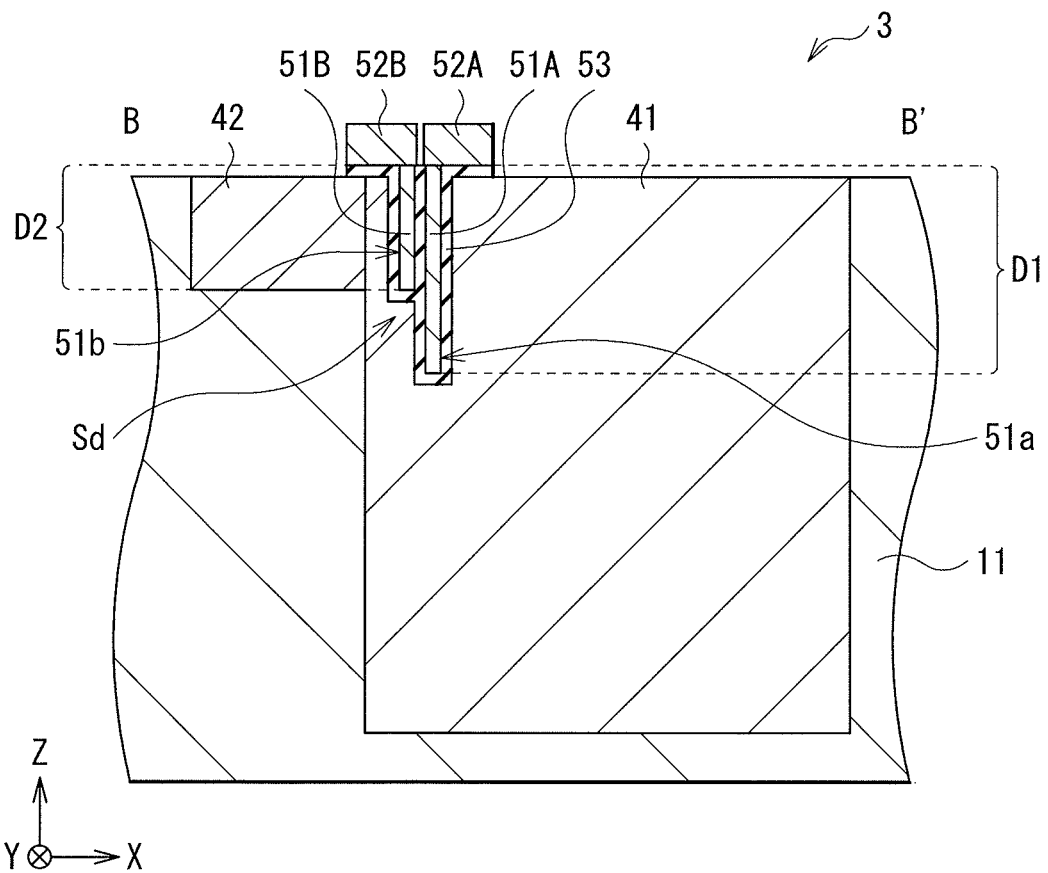

[Fig. 37A]
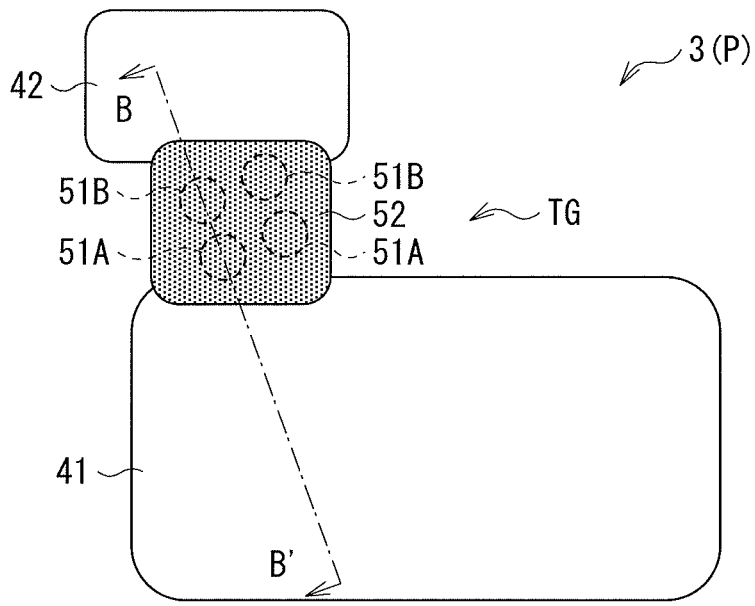
[Fig. 37B]
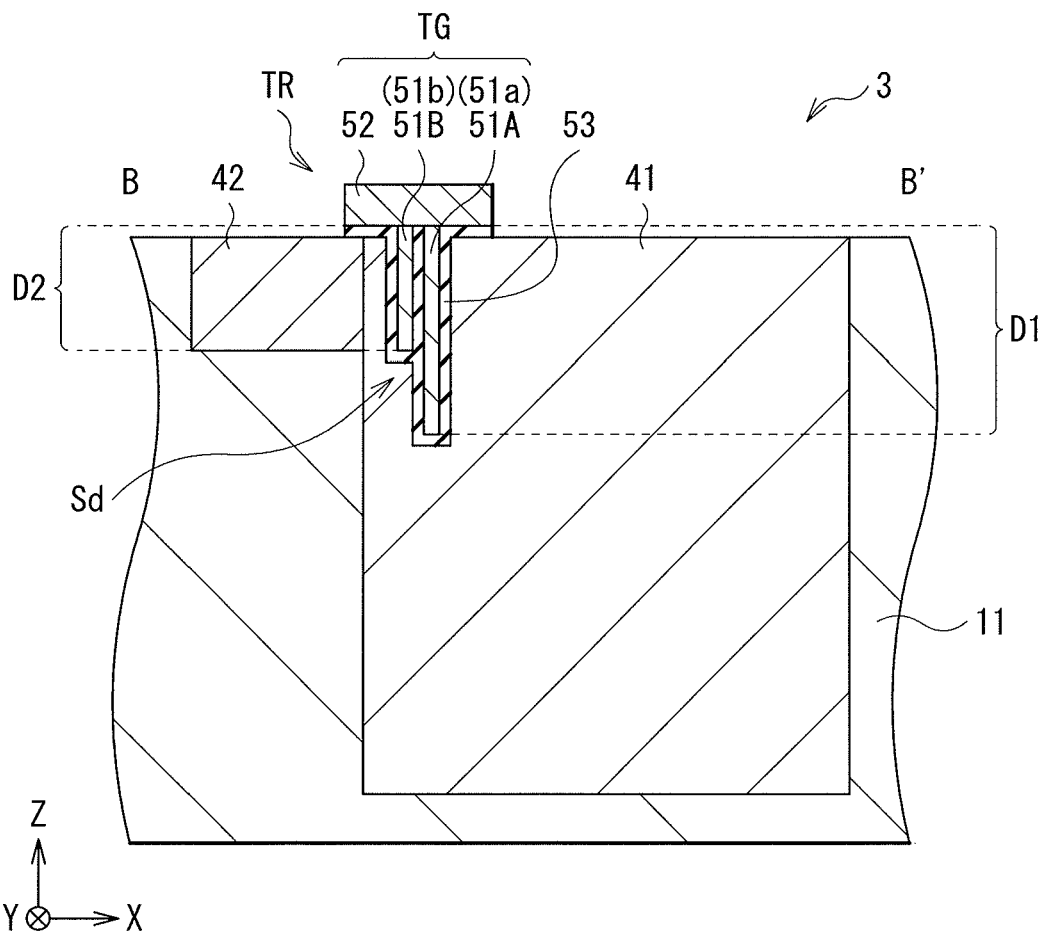

[Fig. 38]
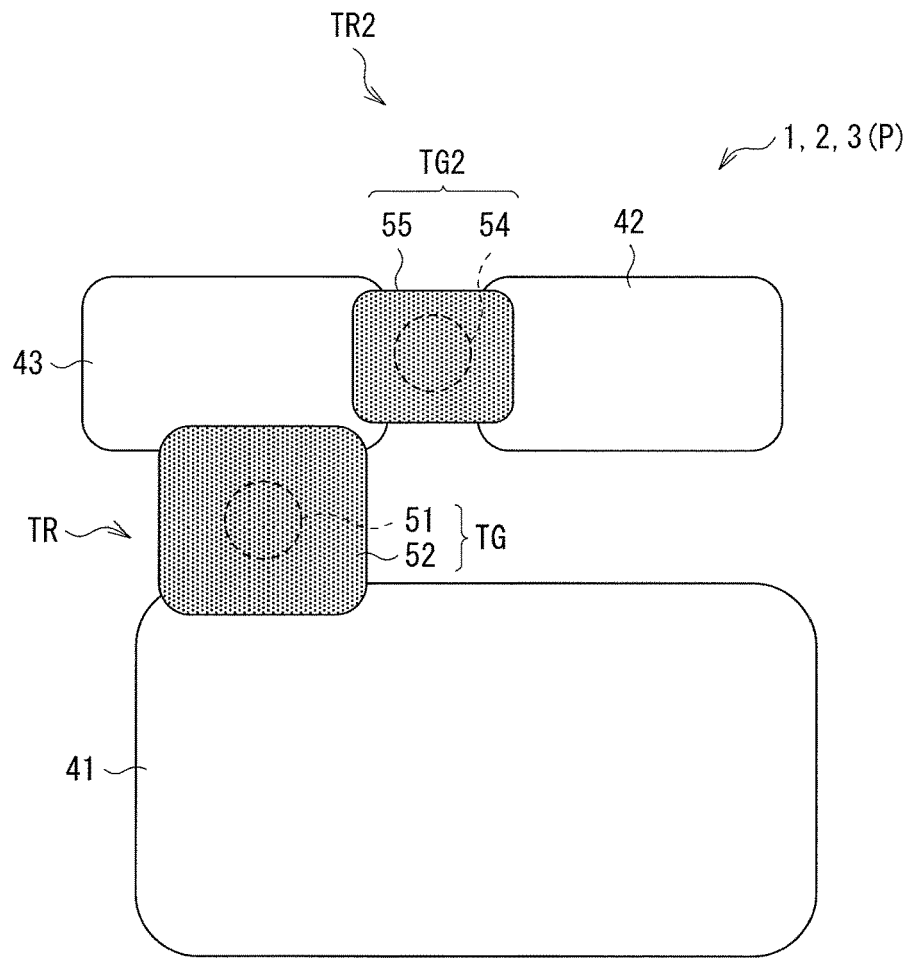
[Fig. 39A]
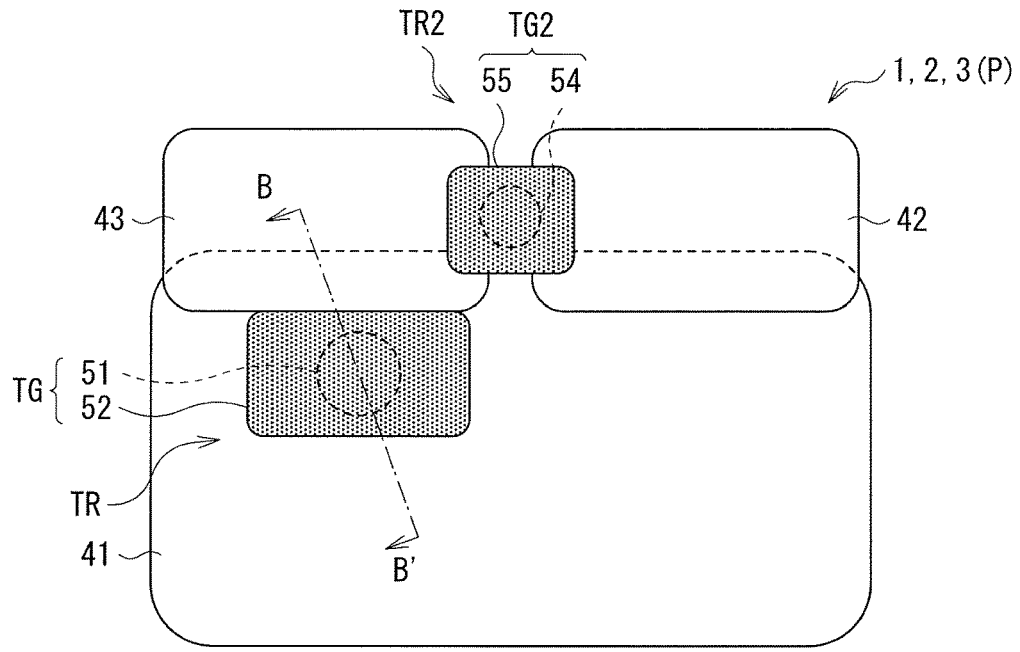

[Fig. 39B]
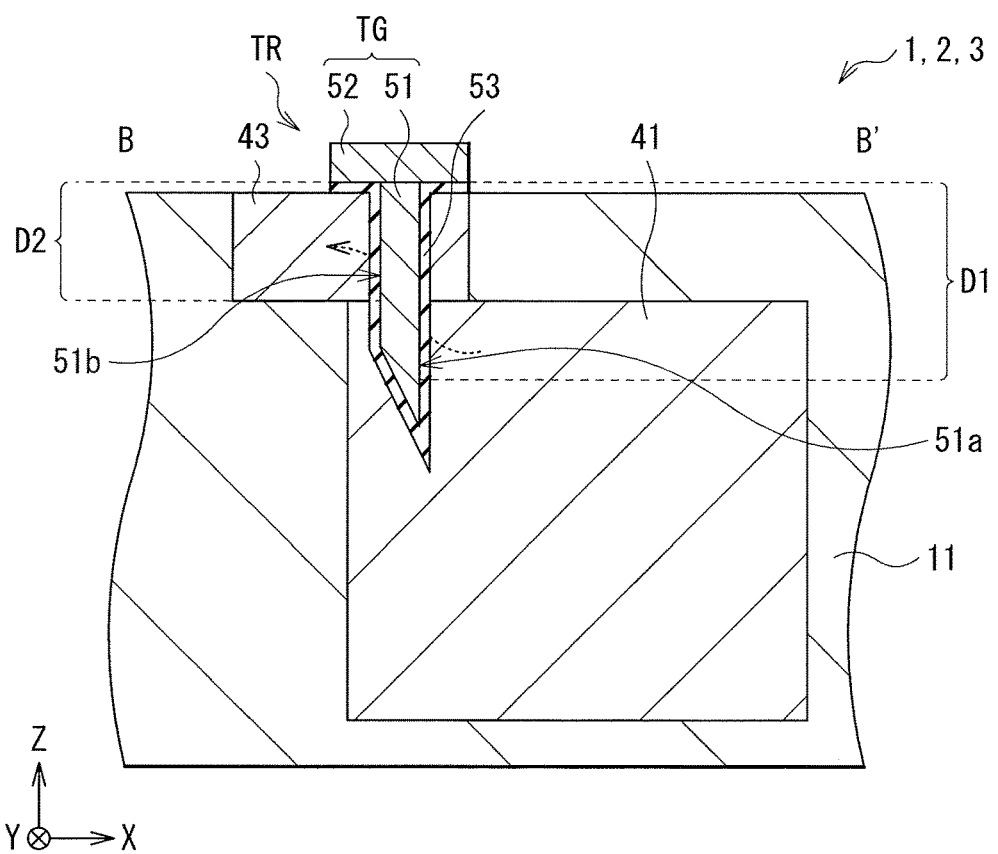
[Fig. 40]
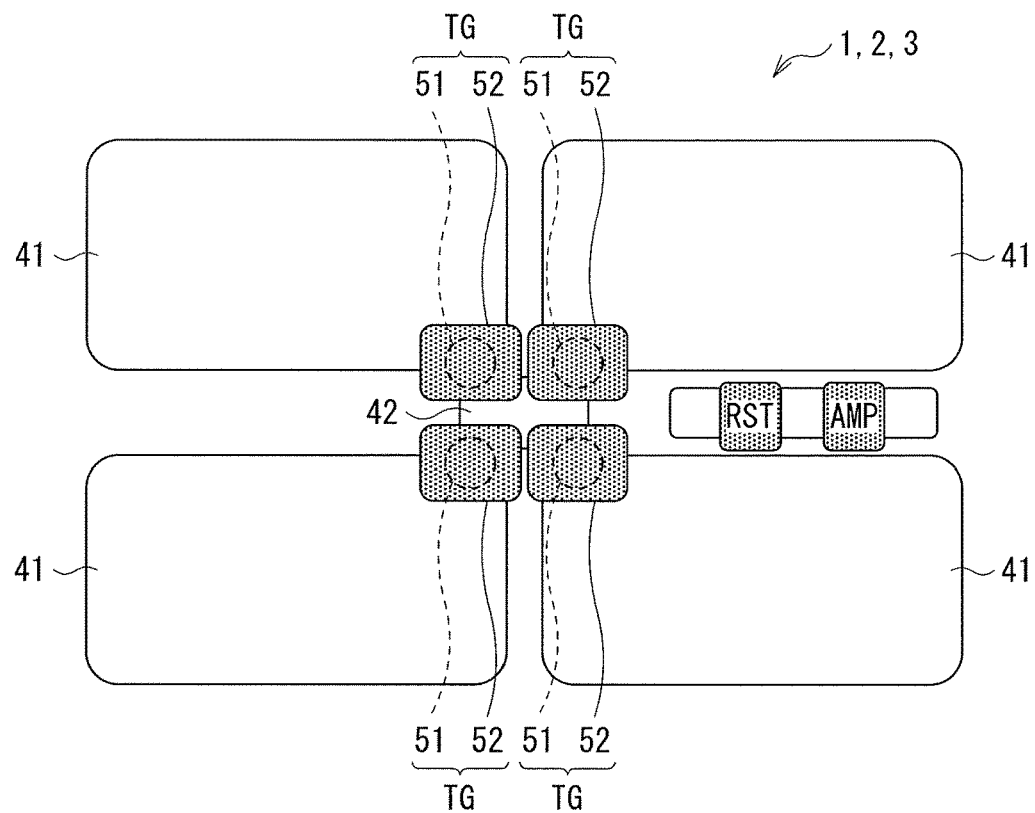

[Fig. 41]
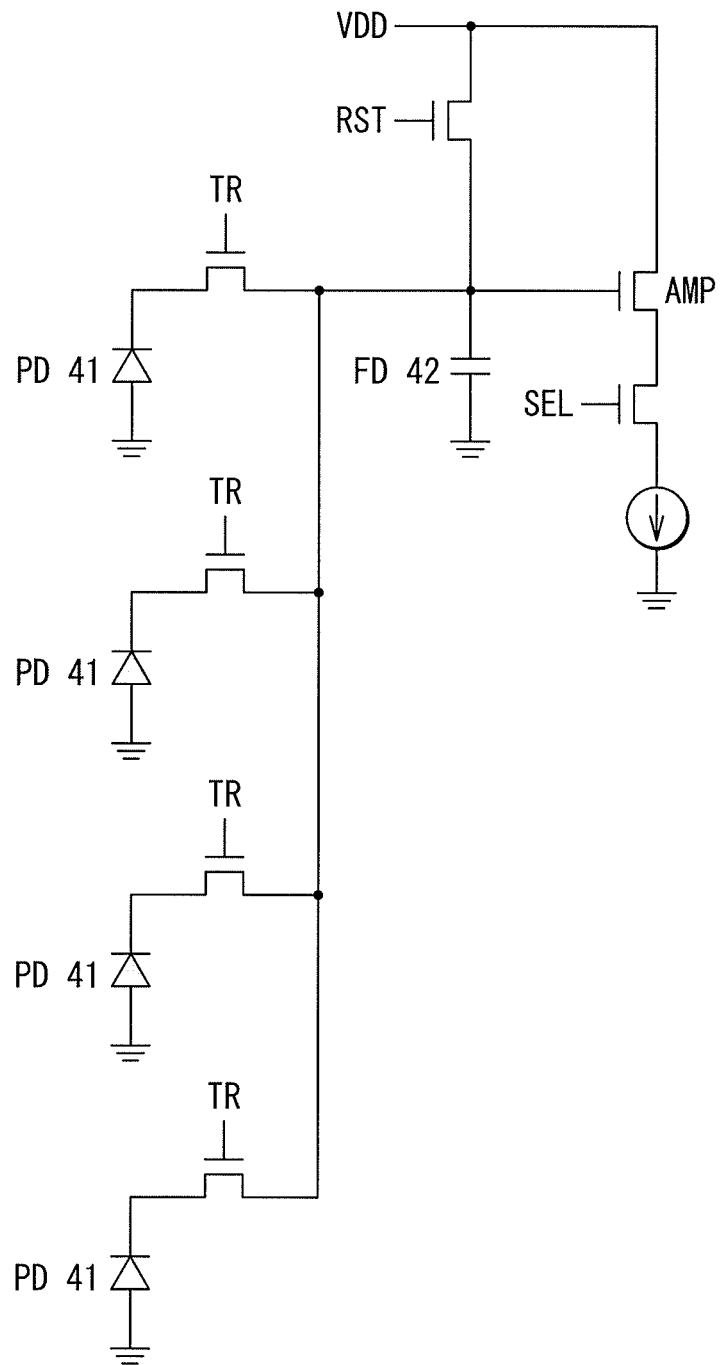

[Fig. 42]
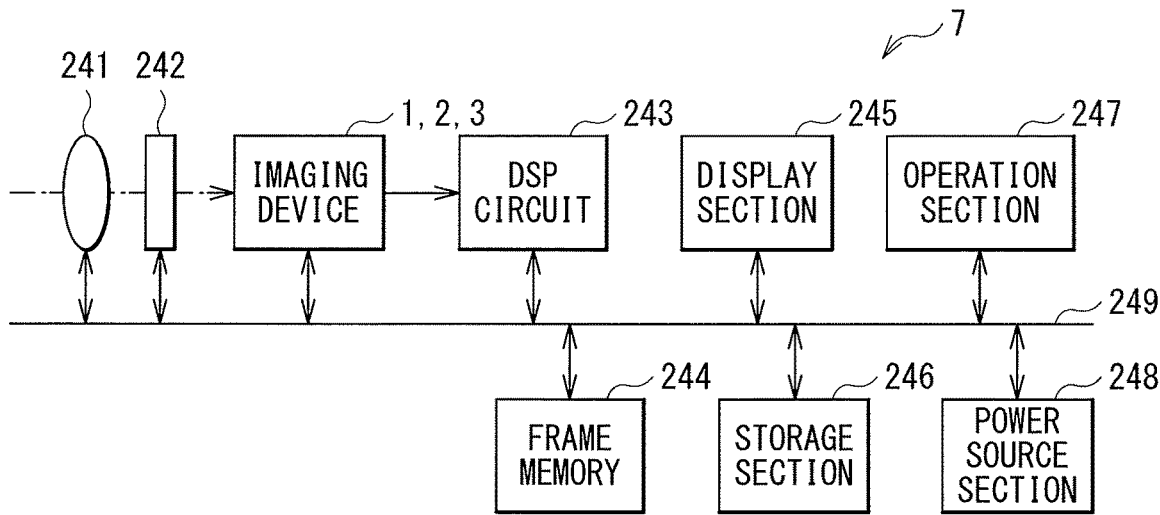
[Fig. 43]
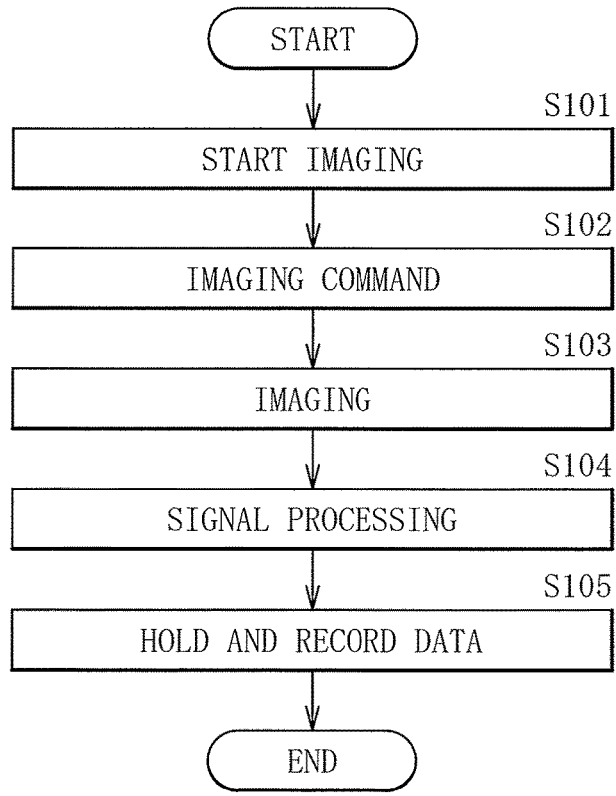

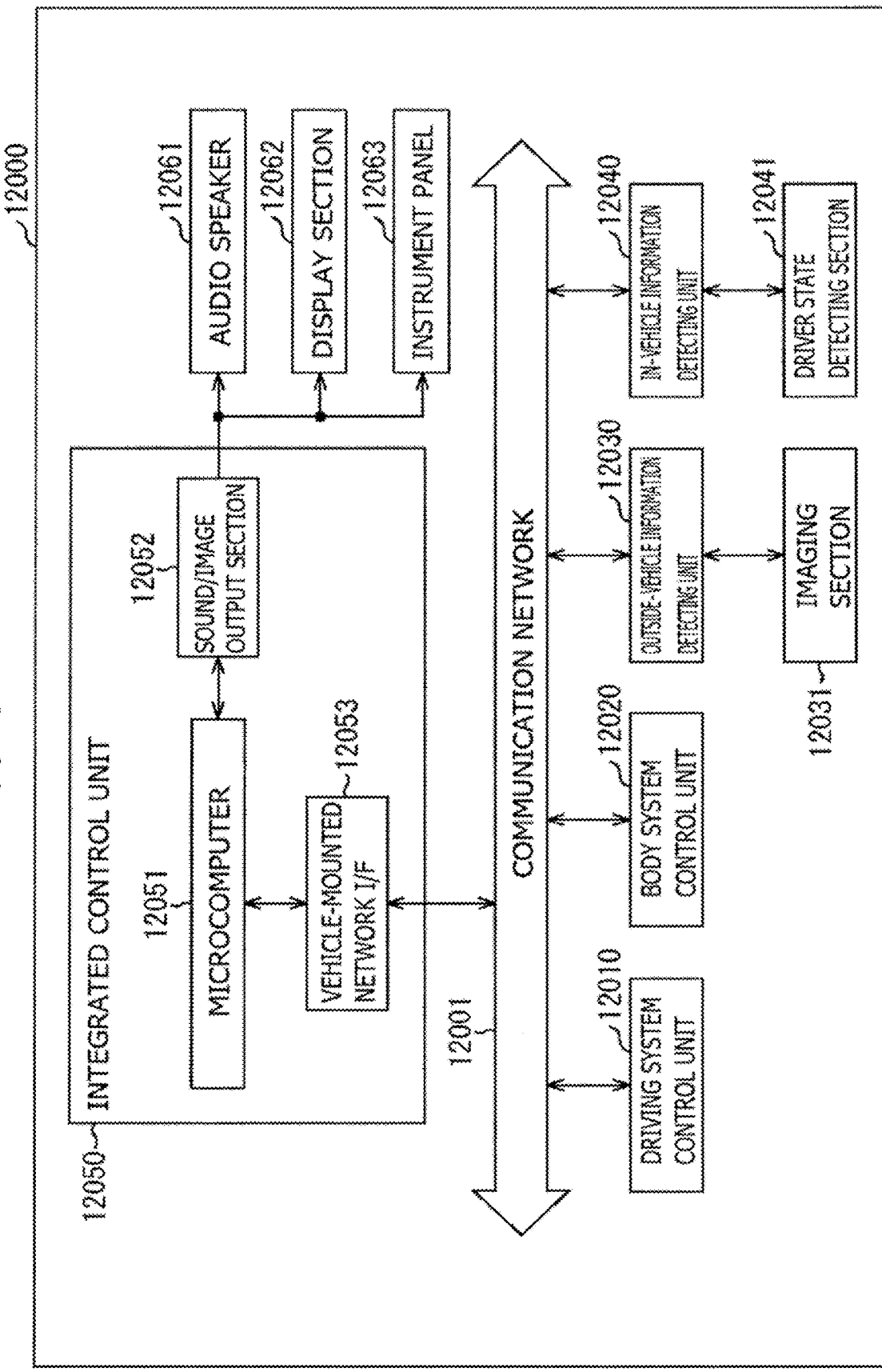

[Fig. 45]
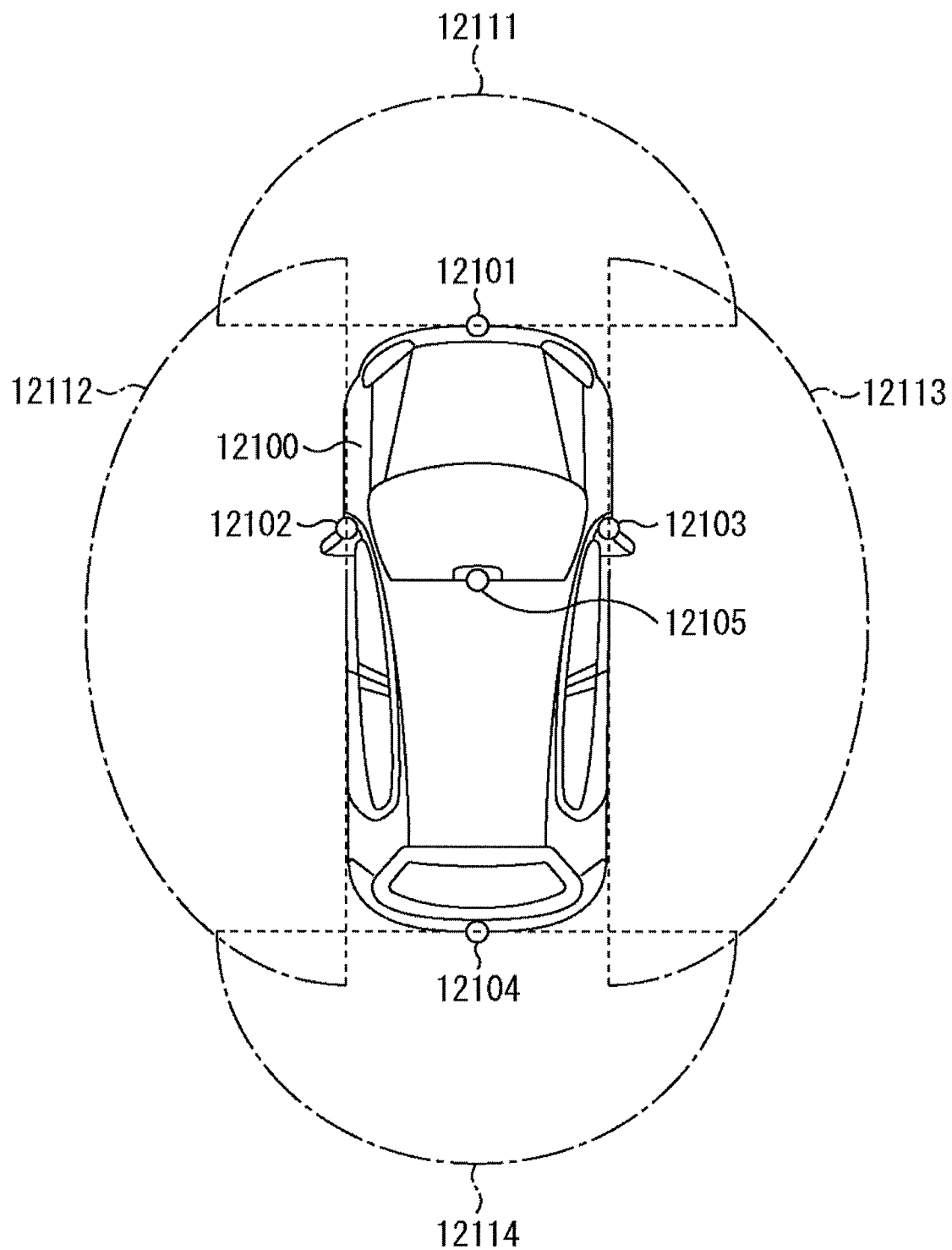

[Fig. 46]
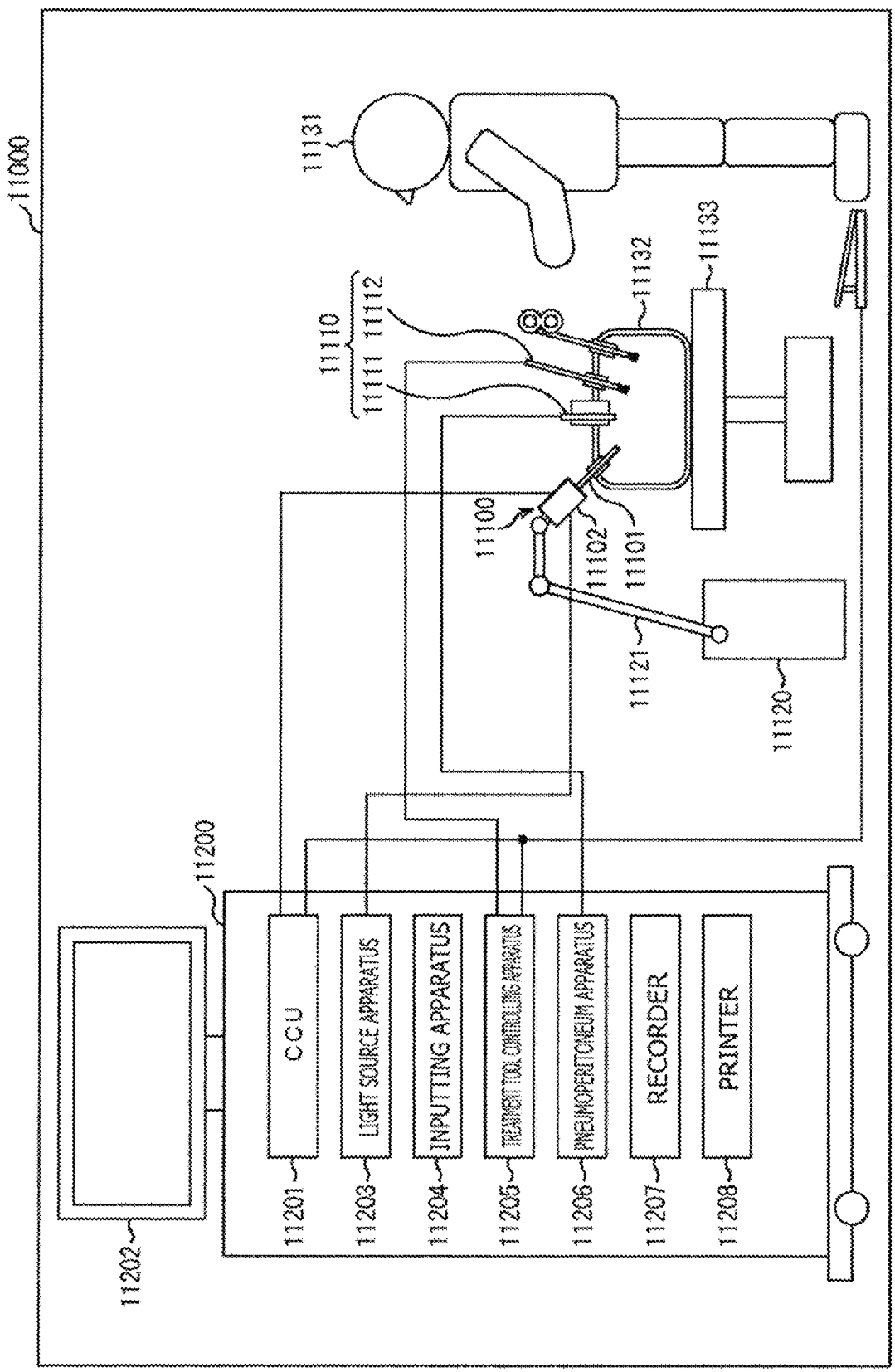

[Fig. 47]
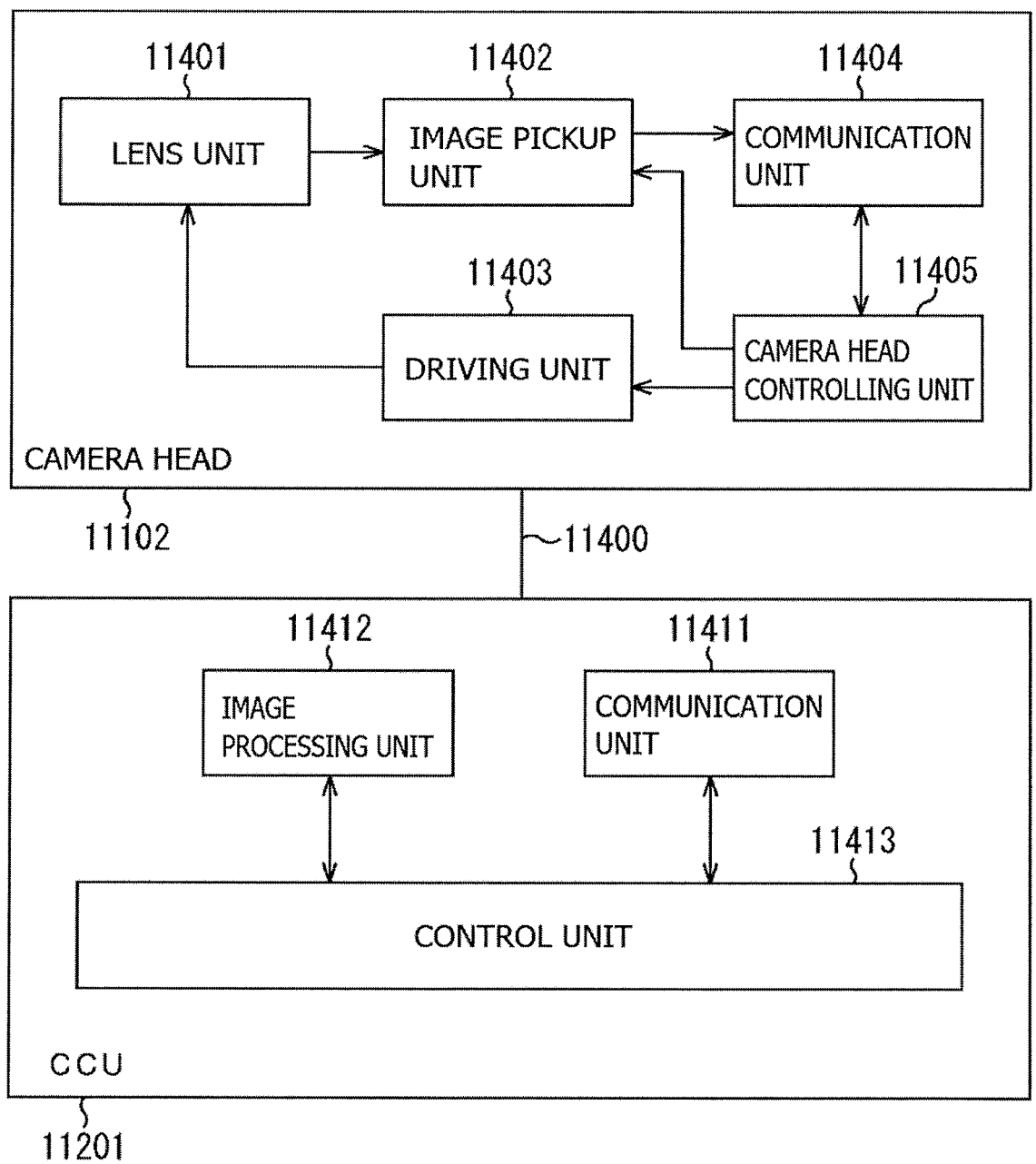

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2020/027048 having an international filing date of 10 Jul. 2020, which designated the United States, which PCT application claimed the benefit of Japanese Patent Application No. 2019-135930, filed 24 Jul. 2019, the entire disclosures of each of which are incorporated herein by reference.

TECHNICAL FIELD

The present disclosure relates to a solid-state imaging device including a semiconductor substrate and an electronic apparatus including the same.

BACKGROUND ART

Development of a solid-state imaging device such as a complementary metal oxide semiconductor) (CMOS) imaging sensor has recently been progressing. Such a solid-state imaging device uses a transfer gate to transfer a signal charge of a photodiode to a floating diffusion.

For example, PTL 1 discloses a method in which a transfer gate uses a vertical gate electrode. The vertical gate electrode is formed by embedding an electrode along a thickness direction of a semiconductor substrate.

CITATION LIST

Patent Literature

[PTL 1] Japanese Unexamined Patent Application Publication No. 2018-190797

SUMMARY

Technical Problem

It has been desired that such a solid-state imaging device should suppress a decrease in image quality resulting from a signal charge remaining in a transfer path, for example.

Accordingly, it is desirable to provide a solid-state imaging device and an electronic apparatus that are able to suppress a decrease in image quality.

Solution to Problem

An imaging device according to an embodiment of the present disclosure includes a semiconductor substrate, a photoelectric conversion element in the semiconductor substrate, and a transfer transistor. The transfer transistor includes a transfer gate. The imaging device includes a charge accumulator in the semiconductor substrate. The transfer gate includes a vertical electrode that extends in a depth direction from a first surface of the semiconductor substrate. The vertical electrode includes first electrode section embedded in the semiconductor substrate on a photoelectric conversion element side of the vertical electrode. The transfer gate includes a second electrode section embedded in the semiconductor substrate on a charge accumulator side of the vertical electrode. A distal end of the first electrode section extends to a first distance from a first surface of the semiconductor substrate. A distal end of the second electrode section extends to a second distance from the first surface of the semiconductor substrate, and the first distance is greater than the second distance.

An electronic apparatus according to an embodiment of the present disclosure includes an optical system, and an imaging device. The optical system forms an image on the imaging device. The imaging device includes a semiconductor substrate, a photoelectric conversion element in the semiconductor substrate, and a transfer transistor. The transfer transistor includes a transfer gate. The imaging device includes a charge accumulator in the semiconductor substrate. The transfer gate includes a vertical electrode that extends in a depth direction from a first surface of the semiconductor substrate, and the vertical electrode includes first electrode section embedded in the semiconductor substrate on a photoelectric conversion element side of the vertical electrode. The transfer gate includes a second electrode section embedded in the semiconductor substrate on a charge accumulator side of the vertical electrode. A distal end of the first electrode section extends to a first distance from a first surface of the semiconductor substrate. A distal end of the second electrode section extends to a second distance from the first surface of the semiconductor substrate, and the first distance is greater than the second distance. The electronic apparatus includes a processor that processes image data output from the imaging device.

In the solid-state imaging device and the electronic apparatus according to the embodiments of the present disclosure, the transfer gate includes the first electrode section and the second electrode section having a dimension in the thickness direction of the semiconductor substrate smaller than a dimension of the first electrode section. This makes adjustment of a modulation volume easy as compared with a case where the transfer gate has a uniform dimension in the thickness direction of the semiconductor substrate.

BRIEF DESCRIPTION OF DRAWINGS

FIG. 1 is a schematic plan view of an overall configuration of an imaging device according to a first embodiment of the present disclosure.

FIG. 2 is a schematic plan view of a configuration of a relevant portion of a light-receiving region illustrated in FIG. 1.

FIG. 3 is a diagram illustrating an example of a circuit configuration of a pixel illustrated in FIG. 2.

FIG. 4 is a schematic view of an example of a cross-sectional configuration taken along a IV-IV' line seen in FIG. 2.

(A) of FIG. 5 is a plan view of one process of a formation method of a vertical electrode illustrated in FIG. 4 and (B) of FIG. 5 is a cross-sectional view of the process illustrated in (A) of FIG. 5.

(A) of FIG. 6 is a plan view of a process subsequent to FIG. 5 and (B) of FIG. 6 is a cross-sectional view of the process illustrated in (A) of FIG. 6.

(A) of FIG. 7 is a plan view of a process subsequent to FIG. 6 and (B) of FIG. 7 is a cross-sectional view of the process illustrated in (A) of FIG. 7.

(A) of FIG. 8 is a plan view of a process subsequent to FIG. 7 and (B) of FIG. 8 is a cross-sectional view illustrated in (A) of FIG. 8.

(A) of FIG. 9 is a plan view of a process subsequent to FIG. 8 and (B) of FIG. 9 is a cross-sectional view illustrated in (A) of FIG. 9.

(A) of FIG. 10 is a plan view of a process subsequent to FIG. 9 and (B) of FIG. 10 is a cross-sectional view illustrated in (A) of FIG. 10.

(A) of FIG. 11 is a plan view of a process subsequent to FIG. 10 and (B) of FIG. 11 is a cross-sectional view illustrated in (A) of FIG. 11.

FIG. 12 is a schematic view of a cross-sectional configuration of a relevant portion of an imaging device according to a comparative example.

FIG. 13A is a diagram illustrating an example of a potential state resulting from a transfer gate illustrated in FIG. 12 being turned on.

FIG. 13B is a diagram illustrating an example of a potential state resulting from the transfer gate illustrated in FIG. 12 being turned off.

FIG. 14 is a diagram illustrating an example of a potential state resulting from a transfer gate illustrated in FIG. 4 being turned on.

FIG. 15 is a schematic cross-sectional view for describing workings and effects of the imaging device illustrated in FIG. 4.

FIG. 16 is a schematic cross-sectional view of a configuration of a relevant portion of an imaging device according to a modification example 1.

FIG. 17 is a cross-sectional schematic view of a configuration of a relevant portion of an imaging device according to a modification example 2.

FIG. 18 is a cross-sectional schematic view of a configuration of a relevant portion of an imaging device according to a modification example 3.

FIG. 19 is a schematic perspective view of a configuration of a vertical electrode illustrated in FIG. 18.

FIG. 20 is a schematic plan view of another example (1) of the configuration of the vertical electrode illustrated in FIG. 18.

FIG. 21 is a schematic plan view of another example (2) of the configuration of the vertical electrode illustrated in FIG. 18.

FIG. 22 is a schematic plan view of a configuration of a relevant portion of an imaging device according to a modification example 4.

FIG. 23A is a schematic plan view of a configuration of a relevant portion of an imaging device according to a second embodiment of the present disclosure.

FIG. 23B is a schematic view of a cross-sectional configuration taken along a B-B' line seen in FIG. 23A.

(A) of FIG. 24 is a plan view of one process of a formation method of a vertical electrode illustrated in FIG. 23A and FIG. 23B and (B) of FIG. 24 is a cross-sectional view of the process illustrated in (A) of FIG. 24.

(A) of FIG. 25 is a plan view of a process subsequent to FIG. 24 and (B) of FIG. 25 is a cross-sectional view of the process illustrated in (A) of FIG. 25.

(A) of FIG. 26 is a plan view of a process subsequent to FIG. 25 and (B) of FIG. 26 is a cross-sectional view of the process illustrated in (A) of FIG. 26.

(A) of FIG. 27 is a plan view of a process subsequent to FIG. 26 and (B) of FIG. 27 is a cross-sectional view of the process illustrated in (A) of FIG. 27.

FIG. 28 is a cross-sectional schematic view of a configuration of a relevant portion of an imaging device according to a modification example 5.

FIG. 29A is a schematic plan view of a configuration of a relevant portion of an imaging device according to a third embodiment of the present disclosure.

FIG. 29B is a schematic view of a cross-sectional configuration taken along a B-B' line seen in FIG. 29A.

FIG. 30 is a schematic cross-sectional view of another example of a configuration of a first vertical electrode and a second vertical electrode illustrated in FIG. 29B.

(A) of FIG. 31 is a plan view of one process of a formation method of the first vertical electrode and the second vertical electrode illustrated in FIG. 29A and FIG. 29B and (B) of FIG. 31 is a cross-sectional view of the process illustrated in (A) of FIG. 31.

(A) of FIG. 32 is a plan view of a process subsequent to FIG. 31 and (B) of FIG. 32 is a cross-sectional view of the process illustrated in (A) of FIG. 32.

(A) of FIG. 33 is a plan view of a process subsequent to FIG. 32 and (B) of FIG. 33 is a cross-sectional view of the process illustrated in (A) of FIG. 33.

(A) of FIG. 34 is a plan view of a process subsequent to FIG. 33 and (B) of FIG. 34 is a cross-sectional view of the process illustrated in (A) of FIG. 34.

FIG. 35A is a schematic plan view of a configuration of a relevant portion of an imaging device according to a modification example 6.

FIG. 35B is a schematic view of a cross-sectional configuration along a B-B' line seen in FIG. 35A.

FIG. 36A is a schematic plan view of a configuration of a relevant portion of an imaging device according to a modification example 7.

FIG. 36B is a schematic view of a cross-sectional configuration taken along a B-B' line seen in FIG. 36A.

FIG. 37A is a schematic plan view of a configuration of a relevant portion of an imaging device according to a modification example 8.

FIG. 37B is a schematic view of a cross-sectional configuration taken along a B-B' line seen in FIG. 37A.

FIG. 38 is a schematic plan view of a configuration of a relevant portion of an imaging device according to a modification example 9.

FIG. 39A is a schematic plan view of another example of a configuration of the imaging device illustrated in FIG. 38.

FIG. 39B is a schematic view of a cross-sectional configuration taken along a B-B' line seen in FIG. 39A.

FIG. 40 is a schematic plan view of a configuration of a relevant portion of an imaging device according to a modification example 10.

FIG. 41 is a diagram illustrating an example of a configuration of an equivalent circuit of the imaging device illustrated in FIG. 40.

FIG. 42 is a diagram illustrating an example of a schematic configuration of an imaging system including the imaging device according to any of the above-described first to third embodiments and the modification examples thereof.

FIG. 43 is a diagram illustrating an example of an imaging procedure of the imaging system of FIG. 42.

FIG. 44 is a block diagram depicting an example of schematic configuration of a vehicle control system.

FIG. 45 is a diagram of assistance in explaining an example of installation positions of an outside-vehicle information detecting section and an imaging section.

FIG. 46 is a view depicting an example of a schematic configuration of an endoscopic surgery system.

FIG. 47 is a block diagram depicting an example of a functional configuration of a camera head and a camera control unit (CCU).

DESCRIPTION OF EMBODIMENTS

Embodiments of the present disclosure are described in detail below with reference to the drawings. It is to be noted that description is given in the following order.

1. First Embodiment (an imaging device that includes a transfer gate including a first electrode section and a second electrode section)
2. Modification Example 1 (an example in which a distal end of a vertical electrode is rounded)
3. Modification Example 2 (an example in which a portion of a gate insulating film has a different thickness)
4. Modification Example 3 (an example in which the vertical electrode has a planar shape other than a circular shape)
5. Modification Example 4 (an example in which a planar electrode has a tapered planar shape)
6. Second Embodiment (an imaging device including a transfer gate with a step between a first electrode section and a second electrode section)
7. Modification Example 5 (an example in which a third electrode section is provided between the second electrode section and the first electrode section)
8. Third Embodiment (an imaging device that includes a transfer gate including a first vertical electrode and a second vertical electrode)
9. Modification Example 6 (an example in which a third vertical electrode is provided between the first vertical electrode and the second vertical electrode)
10. Modification Example 7 (an example in which a planar electrode includes a first planar electrode and a second planar electrode)
11. Modification Example 8 (an example in which the transfer gate includes a plurality of vertical electrodes)
12. Modification Example 9 (an example of a global-shutter imaging device)
13. Modification Example 10 (an example in which a floating diffusion is shared by a plurality of photodiodes)
14. Application Example
15. Practical Application Examples First Embodiment (Configuration of Imaging Device 1)

FIG. 1 schematically illustrates an example of a functional configuration of a solid-state imaging device (imaging device 1) according to a first embodiment of the present disclosure. The imaging device 1 has sensitivity to light with a wavelength in a visible region, for example. The imaging device 1 has a quadrangular light-receiving region 10P and a peripheral region 10B at an outside of the light-receiving region 10P, for example. A peripheral circuit for driving the light-receiving region 10P is provided in the peripheral region 10B.

A plurality of pixels P in a two-dimensional arrangement is provided in the light-receiving region 10P of the imaging device 1, for example. The peripheral circuit provided in the peripheral region 10B includes a row scanner 201, a horizontal selector 203, a column scanner 204, and a system controller 202, for example.

For example, the pixels P are wired with pixel drive lines Lread (e.g., a row selection line and a reset control line) for respective pixel rows and vertical signal lines Lsig for respective pixel columns. The pixel drive lines Lread each transmit a drive signal for reading a signal from each of the pixels P. One end of the pixel drive line Lread is coupled to a corresponding one of output terminals, corresponding to the respective rows, of the row scanner 201.

The row scanner 201 includes a shift register, an address decoder, etc., and is a pixel driver that drives the pixels P in the light-receiving region 10P on a row-by-row basis, for example. A signal outputted from each of the pixels P in a pixel row selectively scanned by the row scanner 201 is supplied to the horizontal selector 203 through a corresponding one of the vertical signal lines Lsig. The horizontal selector 203 includes an amplifier, a horizontal selection switch, etc. provided for each vertical signal line Lsig.

The column scanner 204 includes a shift register, an address decoder, etc., and drives the horizontal selection switches of the horizontal selector 203 in sequence while scanning. Such selective scanning by the column scanner 204 causes signals from the respective pixels transmitted through the respective vertical signal lines Lsig, to be outputted in sequence to a horizontal signal line 205 and inputted to an unillustrated signal processor or the like through the horizontal signal line 205.

The system controller 202 receives an externally provided clock, data, etc. on instructions of operation modes, and outputs data such as internal information regarding the imaging device 1. The system controller 202 also includes a timing generator that generates a variety of timing signals, and performs drive control of the row scanner 201, the horizontal selector 203, the column scanner 204, etc. on the basis of the variety of timing signals generated by the timing generator.

FIG. 2 illustrates a schematic planar configuration of the light-receiving region 10P illustrated in FIG. 1. FIG. 2 illustrates one of the pixels P in the light-receiving region 10P. For example, each of a plurality of pixels P includes a photodiode (PD) 41, a transfer transistor TR, a floating diffusion (FD) 42, a reset transistor RST, and an amplification transistor AMP. Here, the PD 41 corresponds to a specific example of a "photoelectric converter" in the present disclosure and the FD 42 corresponds to a specific example of a "first charge accumulator" in the present disclosure.

FIG. 3 illustrates an example of a pixel circuit configuration of the imaging device 1. For example, the PD 41 is electrically coupled to the reset transistor RST, the amplification transistor AMP, and the selection transistor SEL through the transfer transistor TR and the FD 42. Such a transistor includes a metal oxide semiconductor field effect transistor (MOSFET), for example.

A cathode of the PD 41 is electrically coupled to a source of the transfer transistor TR and an anode of the PD 41 is electrically coupled to a reference potential line (e.g., ground). A drain of the transfer transistor TR is electrically coupled to the FD 42. A gate of the transfer transistor TR is electrically coupled to a pixel drive line (the pixel drive line Lread in FIG. 1), for example.

The FD 42 is electrically coupled to a source of the reset transistor RST and a gate of the amplification transistor AMP. A drain of the reset transistor RST and a drain of the amplification transistor AMP are coupled to a power source line VDD. A gate of the reset transistor RST is electrically coupled to the pixel drive line. A source of the amplification transistor AMP is electrically coupled to a drain of the selection transistor SEL. A source of the selection transistor SEL is electrically coupled to a vertical signal line (the vertical signal line Lsig in FIG. 1), and a gate of the selection transistor SEL is electrically coupled to the pixel drive line.

In a case where the transfer transistor TR is turned on, the transfer transistor Tr transfers the signal charge of the PD 41 to the FD 42. The reset transistor RST resets a potential of the FD 42 to a predetermined potential. In a case where the reset transistor RST is turned on, the reset transistor RST resets the potential of the FD 42 to a potential of the power source line VDD. The amplification transistor AMP generates, as a pixel signal, a signal with a voltage corresponding to a level of a charge held in the FD 42. The amplification transistor AMP serves as a source-follower amplifier, and outputs a pixel signal with a voltage corresponding to a level of a charge generated by the PD 41. The selection transistor SEL controls a timing of output of the pixel signal from the amplification transistor AMP. In a case where the selection transistor SEL is turned on, the amplification transistor AMP amplifies the potential of the FD 42 and outputs a voltage corresponding to the thus-amplified potential to the horizontal selector 203 through the vertical signal line.

FIG. 4 illustrates a cross-sectional configuration taken along a IV-IV' line in FIG. 2. The imaging device 1 includes a semiconductor substrate 11 having a front surface 11Sa and a back surface 11Sb that are opposed to each other. For example, the front surface 11Sa of the semiconductor substrate 11 is provided with an unillustrated multilayer wiring line layer and the back surface 11Sb serves as a light-receiving surface. For example, this imaging device 1 is a back-side illumination type solid-state imaging device.

The semiconductor substrate 11 includes p-type silicon (Si), for example. The PD 41 is provided on the semiconductor substrate 11 for each pixel P. This PD 41 is formed to have a predetermined dimension from a vicinity of the front surface 11Sa of the semiconductor substrate 11 in a thickness direction (a Z-axis direction in FIG. 4) of the semiconductor substrate 11. The PD 41 is an n-type impurity diffusion region, for example. This PD 41 has a p-n junction with an unillustrated p-well provided in the vicinity of the front surface 11Sa of the semiconductor substrate 11, for example. That is, the PD 41 is a so-called p-n junction photodiode.

The FD 42 is provided in the vicinity of the front surface 11Sa of the semiconductor substrate 11, for example. The signal charge generated by the PD 41 is transferred to this FD 42 through the transfer transistor TR. The FD 42 is formed by diffusing an n-type impurity at a high concentration in the unillustrated p-well provided in the vicinity of the front surface 11Sa of the semiconductor substrate 11, for example. That is, the FD 42 is an n-type impurity diffusion region provided in the vicinity of the front surface 11Sa of the semiconductor substrate 11. For example, the PD 41 is formed reaching a deeper level (a back surface 11Sb side) in the semiconductor substrate 11 as compared with the FD 42. In other words, a dimension of the FD 42 in a thickness direction of the semiconductor substrate 11 is smaller than a dimension of the PD 41 in the thickness direction of the semiconductor substrate 11.

The transfer transistor TR is provided between the PD 41 and the FD 42. This transfer transistor TR transfers the signal charge generated by the PD 41 to the FD 42. The transfer transistor TR includes a transfer gate TG and a gate insulating film 53, for example. The transfer gate TG has a T-shaped cross section, for example. This transfer gate TG includes a vertical electrode 51 and a planar electrode 52, for example. The transfer gate TG includes polycrystal silicon (Poly-Si), for example. The gate insulating film 53 is provided between each of the vertical electrode 51 and the planar electrode 52 and the semiconductor substrate 11. The gate insulating film 53 includes silicon oxide (SiO), etc., for example.

The vertical electrode 51 is embedded inside the semiconductor substrate 11 from the front surface 11Sa, extending in the thickness direction of the semiconductor substrate 11 by a predetermined length. The vertical electrode 51 extends substantially vertically with respect to the front surface 11Sa, for example. The transfer gate TG includes the vertical electrode 51, which makes it possible to efficiently read the signal charge of the PD 41 from the PD 41 formed at a deeper level in the semiconductor substrate 11.

The planar electrode 52 is provided on the front surface 11Sa of the semiconductor substrate 11. The planar electrode 52 is substantially horizontal to the front surface 11Sa, for example. For example, the vertical electrode 51 has a circular planar shape and the planar electrode 52 has a quadrangular, such as square or rectangular, planar shape (FIG. 2). For example, the vertical electrode 51 is provided in a middle portion of the planar electrode 52 in a plane (XY plane) view. The vertical electrode 51 is coupled to the planar electrode 52 (FIG. 4).

In the present embodiment, the vertical electrode 51 includes a first electrode section 51a at a side of the PD 41 and a second electrode section 51b provided selectively at a position closer to the FD 42 than the first electrode section 51a. The first electrode section 51a has a dimension D1 in the thickness direction of the semiconductor substrate 11, and the second electrode section 51b has a dimension D2 in the thickness direction of the semiconductor substrate 11. The dimension D2 is smaller than the dimension D1 (D2<D1). Although it will be described later in detail, this makes it easy to adjust a modulation volume as compared with a case where the vertical electrode 51 has a uniform dimension in the thickness direction of the semiconductor substrate 11 (see later-described FIG. 12).

A dimension of the vertical electrode 51 in the thickness direction of the semiconductor substrate 11 is gradually reduced along a signal charge transfer path from the PD 41 to the FD 42. The first electrode section 51a is provided adjacent to the PD 41 in the signal charge transfer path from the PD 41 to the FD 42, for example. The dimension D1 of the first electrode section 51a is a maximum value of the dimension of the vertical electrode 51 in the thickness direction of the semiconductor substrate 11, for example. The second electrode section 51b is provided adjacent to the FD 42 in the signal charge transfer path from the PD 41 to the FD 42, for example. The dimension D2 of the second electrode section 51b is a minimum value of the dimension of the vertical electrode 51 in the thickness direction of the semiconductor substrate 11, for example. This variation in dimension from the first electrode section 51a (dimension D1) to the second electrode section 51b (dimension D2) results in formation of a slanted surface Ss of the vertical electrode 51. The slanted surface Ss is a surface coupling a distal end of first electrode section 51a and a distal end of the second electrode section 51b to each other, and is an end surface of the vertical electrode 51 embedded in the semiconductor substrate 11. The slanted surface Ss is slanted (in an intersecting direction) with respect to the front surface 11Sa and the back surface 11Sb of the semiconductor substrate 11.

(Formation Method of Vertical Electrode 51)

Next, a formation method of the vertical electrode 51 will be described with reference to (A) and (B) of FIG. 5 to (A) and (B) of FIG. 11. (A) of FIG. 5 to (A) of FIG. 11 each illustrate a planar (XY-planar) configuration on the front surface 11Sa side of the semiconductor substrate 11 and (B) of FIG. 5 to (B) of FIG. 11 each illustrate a cross-sectional configuration corresponding to FIG. 4.

First, as illustrated in (A) and (B) of FIG. 5, a silicon nitride film 12 and a silicon oxide film 13 are formed in this sequence on the front surface 11Sa of the semiconductor substrate 11. Specifically, the silicon nitride film 12 and the silicon oxide film 13 are formed as follows. The silicon nitride film 12 is deposited all over the front surface 11Sa of the semiconductor substrate 11 and then patterned to form an opening (an opening 12M in (A) and (B) of FIG. 7) of the silicon nitride film 12 in a vicinity of a region where the vertical electrode 51 is to be formed. Subsequently, the silicon oxide film 13 is formed all over the front surface 11Sa of the semiconductor substrate 11 to fill this opening of the silicon nitride film 12. Thereafter, the silicon nitride film 12 and the silicon oxide film 13 are planarized. This removes the silicon oxide film 13 on the silicon nitride film 12 to form the silicon oxide film 13 in the opening of the silicon nitride film 12.

After the formation of the silicon nitride film 12 and the silicon oxide film 13, a polysilicon film 14 having an opening 14M is formed as illustrated in (A) and (B) of FIG. 6. The opening 14M of the polysilicon film 14 is formed at a position overlapping an end portion of a region where the silicon oxide film 13 is formed in a plan view. The opening 14M of the polysilicon film 14 is formed to be smaller than the region where the silicon oxide film 13 is formed.

Subsequently, as illustrated in (A) and (B) in FIG. 7, the silicon oxide film 13 is etched through the opening 14M of the polysilicon film 14 by one-side self-alignment. This causes the silicon oxide film 13 to selectively remain at an end portion of the opening 12M of the silicon nitride film 12 to form a slanted surface of the silicon oxide film 13.

Subsequently, as illustrated in (A) and (B) of FIG. 8, a polysilicon film 15 is formed all over the front surface 11Sa of the semiconductor substrate 11. The polysilicon film 15 is deposited along the slanted surface of the silicon oxide film 13, for example.

Subsequently, as illustrated in (A) and (B) of FIG. 9 to (A) and (B) of FIG. 11, a groove 11V is formed in the semiconductor substrate 11. For example, the groove 11V is formed by etching the semiconductor substrate 11 together with the polysilicon film 15 and the silicon oxide film 13. For example, this etching is performed under conditions where respective etching rates of the polysilicon film 15, the semiconductor substrate 11, and the silicon oxide film 13 are substantially equal and a selection ratio between these etching rates and an etching rate of the silicon nitride film 12 is increased. The groove 11V having a slanted surface is thus formed. Subsequently, an insulating material and an electrically conductive material are embedded in this sequence in this groove 11V, thereby forming the gate insulating film 53 and the vertical electrode 51 with the slanted surface Ss.

(Operation of Imaging Device 1)

Such an imaging device 1 acquires a signal charge as follows, for example. When light enters the back surface 11Sb of the semiconductor substrate 11, the light is detected (absorbed) by the PD 41 of each of the pixels P and photoelectrically converted. For example, electrons of electron-hole pairs generated by the PD 41 are accumulated in the FD 42, and holes are discharged into the power source line VSS.

(Workings and Effects of Imaging Device 1)

In the imaging device 1 according to the present embodiment, the vertical electrode 51 of the transfer gate TG includes the first electrode section 51a having the dimension D1 on the PD 41 side and the second electrode section 51b having the dimension D2 (D2<D1) selectively provided at the position closer to the FD 42 than the first electrode section 51a. This makes it easy to adjust the modulation volume as compared with a case where the transfer gate TG has a uniform dimension in the thickness direction of the semiconductor substrate 11. Workings and effects of this imaging device 1 will be described below in detail.

FIG. 12 illustrates a cross-sectional configuration of a relevant portion of a light-receiving region of a solid-state imaging device (imaging device 1000) according to a comparative example. FIG. 12 corresponds to FIG. 4 illustrating the imaging device 1. This imaging device 1000 includes the transfer gate TG including the vertical electrode 51 and the planar electrode 52 in each pixel similarly to the imaging device 1. The imaging device 1000 is different from the imaging device 1 in that the vertical electrode 51 has a uniform dimension in the thickness direction of the semiconductor substrate 11. For example, in the imaging device 1000, the dimension of the vertical electrode 51 in the thickness direction of the semiconductor substrate 11 is the dimension D1 at any position in the signal charge transfer path from the PD 41 to the FD 42.

Such an imaging device 1000 includes the transfer gate TG including the vertical electrode 51, and is able to efficiently read a signal charge of the PD 41 formed at a deeper level in the semiconductor substrate 11. However, if the vertical electrode 51 is designed to allow signal charges to be completely transferred, a modulation volume in a vicinity of the vertical electrode 51 increases and, consequently, a potential dip is likely to be generated. Moreover, an increase in the modulation volume causes formation of a large number of transfer paths Path from the PD 41 to the FD 42.

FIG. 13A and FIG. 13B each illustrate a potential state in the vicinity of the transfer gate TG. FIG. 13A illustrates a potential state resulting from a gate voltage being turned on and FIG. 13B illustrates a potential state resulting from the gate voltage being turned off. As illustrated in FIG. 13A, a modulation portion 51P increases in response to the gate voltage being turned on, so that a potential dip is likely to be generated in a portion (portion B) of the vertical electrode 51. The portion B is a distal portion on the FD 42 side of the vertical electrode 51, for example. Moreover, an increase in the modulation portion 51P causes formation of a large number of the transfer paths Path from the PD 41 to the FD 42. Due to the generation of the potential dip in the portion B and the increase in the number of the transfer paths Path, signal charges are likely to remain in the transfer paths in the imaging device 1000. These signal charges remaining in the transfer paths may cause a failure in transferring signal charges resulting from drawing the charges. The failure in transferring the signal charges resulting from drawing the charges causes a decrease in image quality such as a white spot, for example.

In contrast, according to the present embodiment, the dimension of the vertical electrode 51 is gradually reduced along the signal charge transfer path from the PD 41 to the FD 42 in the thickness direction of the semiconductor substrate 11. In other words, the dimension D2 of the second electrode section 51b provided at a position adjacent to the FD 42 is smaller than the dimension D1 of the first electrode section 51a provided at a position adjacent to the PD 41. This makes adjustment to a desired modulation volume easy as compared with the imaging device 1000.

FIG. 14 illustrates a potential state in the vicinity of the transfer gate TG resulting from the gate voltage being turned off. Providing the smaller second electrode section 51b at the position adjacent to the FD 42 as illustrated makes adjustment to a desired modulation volume easy in the vicinity of the vertical electrode 51. Specifically, the modulation volume is reduced as compared with the vertical electrode 51 having the uniform dimension (FIG. 12).

Referring to FIG. 15, workings and effects of the imaging device 1 will be described below. In the imaging device 1, the modulation volume is adjusted to a desired value, thereby making it possible to effectively suppress generation of a potential dip in the distal portion (the portion B in FIG. 13A) of the vertical electrode 51 while maintaining an ability to transfer a signal charge. Moreover, it is possible to shorten the transfer paths Path and suppress an increase in the number of the transfer paths Path as compared with the imaging device 1000. This reduces signal charges remaining in the transfer paths. For this reason, it is possible to suppress occurrence of a transfer failure resulting from drawing the charges and, consequently, suppress a decrease in image quality.

As described above, the transfer gate TG (more specifically, the vertical electrode 51) of the imaging device 1 according to the present embodiment includes the first electrode section 51a on the PD 41 side and the second electrode section 51b having the smaller dimension in the thickness direction of the semiconductor substrate 11 than that of the first electrode section 51a. This makes it possible to reduce signal charges remaining in the transfer paths while maintaining the desired modulation volume. Therefore, it is possible to suppress a decrease in image quality.

Moreover, the first electrode section 51a and the second electrode section 51b are coupled to each other through the slanted surface Ss, thereby making it easier to reduce the modulation volume as compared with a case where a step (e.g., a step sd in later-described FIG. 23B) is provided between the first electrode section 51a and the second electrode section 51b. Therefore, it is possible to more effectively reduce signal charges remaining in the transfer paths.

Modification examples of the above-described first embodiment and other embodiments will be described below. In the following description, the same components as those of the above-described embodiment are denoted by the same reference numerals, and the description thereof will be omitted as necessary.

Modification Example 1

FIG. 16 schematically illustrates a cross-sectional configuration of the transfer gate TG of the imaging device 1 according to a modification example 1 of the above-described first embodiment. A distal end of the vertical electrode 51 of this transfer gate TG has a rounded corner portion CP. Except for this, the imaging device 1 according to the modification example 1 has a configuration similar to that of the imaging device 1 according to the above-described first embodiment, and workings and effects thereof are also similar.

A distal end of the first electrode section 51a has the corner portion CP, for example. The corner portion CP has a curved surface and is rounded, for example. In a vicinity of such a rounded corner portion CP, the gate insulating film 53 (FIG. 4) is uniformly deposited as compared with a sharp-pointed corner portion CP. This reduces concentration of an electric field resulting from a reduction in the thickness of the gate insulating film 53 in the vicinity of the corner portion CP, which makes it possible to suppress a decrease in image quality such as a white spot. A corner portion of the distal end of the second electrode section 51b may be rounded.

Modification Example 2

FIG. 17 schematically illustrates a cross-sectional configuration of each of the transfer gate TG and the gate insulating film 53 of the imaging device 1 according to a modification example 2 of the above-described first embodiment. Here, a thickness (a later-described thickness t2) of a portion of the gate insulating film 53 provided between the vertical electrode 51 and the semiconductor substrate 11 (FIG. 4) is larger than a thickness (a later-described thickness t1) of the other portion of the gate insulating film 53. Except for this, the imaging device 1 according to the modification example 2 has a configuration similar to that of the imaging device 1 according to the above-described first embodiment, and workings and effects thereof are also similar.

For example, a thickness (thickness t2) of the gate insulating film 53 covering the corner portion CP of the distal end of the vertical electrode 51 (more specifically, the first electrode section 51a) is larger than a thickness (thickness t1) of the gate insulating film 53 covering the other portion of the vertical electrode 51 (t2>t1). Such an increase in the thickness of the gate insulating film 53 covering the corner portion CP results in formation of a signal charge transfer path bypassing the corner portion CP. The concentration of an electric field is likely to occur at the corner portion CP as described in the modification example 1. If the signal charge transfer path is formed passing through this corner portion CP, transfer efficiency may decrease. Accordingly, increasing the thickness of the gate insulating film 53 covering the corner portion CP makes it possible to form the signal charge transfer path bypassing the corner portion CP, thereby improving transfer efficiency. A thickness of the gate insulating film 53 covering the vertical electrode 51 except for the corner portion CP may be increased to be larger than a thickness of the other portion of the gate insulating film 53.

Modification Example 3

FIG. 18 schematically illustrates a planar configuration of a relevant portion of the imaging device 1 according to a modification example 3 of the above-described first embodiment. FIG. 18 illustrates a planar configuration of a relevant portion of each of the pixels P of the imaging device 1. In this imaging device 1, the vertical electrode 51 of the transfer gate TG has a planar shape other than a circular shape. Except for this, the imaging device 1 according to the modification example 3 has a configuration similar to that of the imaging device 1 according to the above-described first embodiment, and workings and effects thereof are also similar.

The vertical electrode 51 has a substantially triangular planar shape, for example. The vertical electrode 51 (transfer gate TG) is provided between the PD 41 and the FD 42 to cause a side and an apex of this triangular shape to be respectively adjacent to the PD 41 and the FD 42, for example. That is, the planar shape of the vertical electrode 51 is tapered along the signal charge transfer path from the PD 41 toward the FD 42. Thus, the signal charge transfer path Path bypassing the vertical electrode 51 is formed to expand on the PD 41 side while being gradually concentrated toward the FD 42. Consequently, as compared with a case where the vertical electrode 51 has a circular planar shape, the signal charge transfer path from the PD 41 toward the FD 42 is shortened, and probability of signal charge trapping in the transfer path is lowered. This makes it possible to improve signal charge transfer efficiency from the PD 41 to the FD 42 and, consequently, improve image quality.

FIG. 19 is a schematic perspective view of a configuration of the vertical electrode 51 illustrated in FIG. 18. For example, the vertical electrode 51 has the shape of a substantially triangular prism. The first electrode section 51a includes, for example, a side surface of this triangular prism and the second electrode section 51b includes, for example, a side edge of this triangular prism. The slanted surface Ss coupling the first electrode section 51a and the second electrode section 51b to each other is provided in one bottom surface of this triangular prism.

FIG. 20 and FIG. 21 each illustrate another example of the planar configuration of the imaging device 1 (pixel P) illustrated in FIG. 18. The vertical electrode 51 may have a planar shape other than a triangular shape. For example, the vertical electrode 51 may have a semicircular planar shape (FIG. 20). In this case, a side corresponding to a rounded portion or diameter of the semicircular shape is provided adjacent to the PD 41. Thus, the vertical electrode 51 is provided with a shape tapered along the signal charge transfer path from the PD 41 toward the FD 42. For example, the vertical electrode 51 may have a polygonal planar shape (FIG. 21). This polygonal shape may provide a shape tapered along the signal charge transfer path from the PD 41 toward the FD 42. A vicinity of an apex of the triangular shape or any other polygonal shape included in the planar shape of the vertical electrode 51 may be rounded.

Modification Example 4

FIG. 22 schematically illustrates a planar configuration of a relevant portion of the imaging device 1 according to a modification example 4 of the above-described first embodiment. FIG. 22 illustrates a planar configuration of a relevant portion of each of the pixels P of the imaging device 1. The planar electrode 52 of the transfer gate TG of this imaging device 1 has a planar shape other than a square shape and a rectangular shape. Except for this, the imaging device 1 according to the modification example 4 has a configuration similar to that of the imaging device 1 according to the above-described first embodiment and workings and effects thereof are also similar.

The planar electrode 52 may have a substantially trapezoidal planar shape, for example. For example, the planar electrode 52 (transfer gate TG) is provided between the PD 41 and the FD 42 to cause a lower base and an upper base of this trapezoidal shape to be respectively adjacent to the PD 41 and the FD 42. A length of the upper base is smaller than a length of the lower base. The planar shape of the planar electrode 52 will be described below in detail.

For example, a pair of sides of the planar electrode 52 extending in a vertical direction relative to a virtual line VL representing the signal charge transfer path from the PD 41 toward the FD 42 is referred to as sides 52da and 52db. The side 52da (lower base) is provided adjacent to the PD 41 and the side 52db (upper base) is provided adjacent to the FD 42. A length of the side 52db is smaller than a length of the side 52da (the side 52db<the side 52da). That is, the planar electrode 52 is in a shape tapered along the signal charge transfer path from the PD 41 toward the FD 42. Thus, right under the planar electrode 52, the signal charge transfer path bypassing the vertical electrode 51 is formed to expand on the PD 41 side while being gradually concentrated toward the FD 42. Consequently, as compared with a case where the planar electrode 52 has a square or rectangular planar shape, the signal charge transfer path from the PD 41 toward the FD 42 is shortened, and probability of signal charge trapping in the transfer path is lowered. This makes it possible to improve signal charge transfer efficiency from the PD 41 to the FD 42 and, consequently, improve image quality. The planar electrode 52 may have any tapered planar shape other than the substantially trapezoidal shape and may have, for example, a planar shape such as a triangular shape, a semicircular shape, or a polygonal shape. A vicinity of an apex of the triangular shape or any other polygonal shape providing the planar shape of the planar electrode 52 may be rounded.

Second Embodiment

FIG. 23A and FIG. 23B each schematically illustrate a configuration of a relevant portion of an imaging device (imaging device 2) according to a second embodiment of the present disclosure. FIG. 23A illustrates a planar configuration of a relevant portion of each of the pixels P of the imaging device 2 and FIG. 23B illustrates a cross-sectional configuration taken along a B-B' line seen in FIG. 23A. FIG. 23B corresponds to FIG. 4 illustrating the imaging device 1 according to the above-described first embodiment. This imaging device 2 has a step (step sd) provided between the first electrode section 51a and the second electrode section 51b of the vertical electrode 51. Except for this, the imaging device 2 has a configuration similar to that of the imaging device 1 according to the above-described first embodiment, and workings and effects thereof are also similar.

A dimension of the vertical electrode 51 in the thickness direction of the semiconductor substrate 11 is reduced stepwise along the signal charge transfer path from the PD 41 to the FD 42. The first electrode section 51a is provided adjacent to the PD 41 in the signal charge transfer path from the PD 41 to the FD 42, and has a predetermined thickness along the transfer path, for example. The second electrode section 51b is provided adjacent to the FD 42 in the signal charge transfer path from the PD 41 to the FD 42, and has a predetermined thickness along the transfer path, for example. This variation in dimension from the first electrode section 51a (dimension D1) to the second electrode section 51b (dimension D2) results in formation of the step sd of the vertical electrode 51 in the thickness direction of the semiconductor substrate 11. The step sd is provided between the distal end of the first electrode section 51a and the distal end of the second electrode section 51b.

The above-described modification examples 1 to 4 are also applicable to the imaging device 2. For example, a distal end of the vertical electrode 51 (first electrode section 51a) of the imaging device 2 may have a rounded corner portion (see FIG. 16). A thickness of a portion of the gate insulating film 53 may be larger than a thickness of the other portion of the gate insulating film 53 (FIG. 17). The vertical electrode 51 may have a planar shape other than a circular shape (see FIG. 18, FIG. 20, and FIG. 21). The planar electrode 52 may have a planar shape other than a square shape and a rectangular shape (see FIG. 22).

Next, a formation method of the vertical electrode 51 having the step sd will be described with reference to (A) and (B) of FIG. 24 to (A) and (B) of FIG. 27. (A) of FIG. 24 to (A) of FIG. 27 each illustrate a planar (XY-planar) configuration on the front surface 11Sa side of the semiconductor substrate 11 and (B) of FIG. 24 to (B) of FIG. 27 each illustrate a cross-sectional configuration corresponding to FIG. 23B.

First, as illustrated in (A) and (B) of FIG. 24, a resist film 21 having an opening 21M is formed on the front surface 11Sa of the semiconductor substrate 11. The opening 21M has a semicircular planar shape, for example. The opening 21M is formed at a position overlapping a region where the first electrode section 51a is to be formed in a plan view. The opening 21M is formed by photolithography, for example.

Next, as illustrated in (A) and (B) of FIG. 25, the semiconductor substrate 11 is dry-etched through the opening 21M of the resist film 21. By doing so, a groove 11VA is formed on a portion, corresponding to the opening 21M, of the semiconductor substrate 11.

Subsequently, as illustrated in (A) and (B) of FIG. 26, the opening 21M of the resist film 21 is widened by photolithography, for example. By doing so, the planar shape of the 21M is changed from a semicircular shape to a circular shape, for example.

Subsequently, as illustrated in (A) and (B) of FIG. 27, the semiconductor substrate 11 is dry-etched through the opening 21M of the resist film 21. By doing so, a groove 11VB is formed on a portion, corresponding to a widened portion of the opening 21M, of the semiconductor substrate 11, and the groove 11VA is made deeper. That is, the groove 11VA is formed deeper than the groove 11VB, resulting in formation of a step between the groove 11VA and the groove 11VB. Subsequently, an insulating material and an electrically conductive material are embedded in this sequence in these grooves 11VA and 11VB. By doing so, the gate insulating film 53 and the first electrode section 51a are formed in the groove 11VA, and the gate insulating film 53 and the second electrode section 51b are formed in the groove 11VB.

The imaging device 2 according to the present embodiment includes the transfer gate TG (more specifically, vertical electrode 51) including the first electrode section 51a and the second electrode section 51b smaller in dimension in the thickness direction of the semiconductor substrate 11 than the first electrode section 51a, similarly to the imaging device 1 according to the above-described first embodiment. This makes it possible to reduce signal charges remaining in the transfer path while maintaining the desired modulation volume. Therefore, it is possible to suppress a decrease in image quality.

Moreover, the single vertical electrode 51 includes the first electrode section 51a and the second electrode section 51b, which makes it easier to reduce the modulation volume as compared with a case where the first electrode section 51a and the second electrode section 51b are separated from each other to be provided in a plurality of vertical electrodes (see later-described FIG. 29A and FIG. 29B). Therefore, it is possible to more effectively reduce signal charges remaining in the transfer paths. Furthermore, it is possible to form the vertical electrode 51 by simple lithography and a simple etching process, which makes a production process easier as compared with that of the vertical electrode 51 described in the above-described first embodiment.

Modification Example 5

FIG. 28 schematically illustrates a cross-sectional configuration of a relevant portion of the imaging device 2 according to a modification example 5 of the above-described second embodiment. FIG. 28 corresponds to FIG. 23B of the above-described second embodiment. The vertical electrode 51 of this imaging device 2 includes a third electrode section 51c between the first electrode section 51a and the second electrode section 51b. Except for this, the imaging device 2 has a configuration similar to that of the imaging device 2 according to the above-described second embodiment, and workings and effects thereof are also similar.

A dimension of the vertical electrode 51 in the thickness direction of the semiconductor substrate 11 is reduced stepwise along the signal charge transfer path from the PD 41 to the FD 42. The third electrode section 51c is provided between the first electrode section 51a and the second electrode section 51b in the signal charge transfer path from the PD 41 toward the FD 42, for example. The third electrode section 51c has a dimension D3 in the thickness direction of the semiconductor substrate 11. This dimension D3 is smaller than the dimension D1 of the first electrode section 51a and larger than the dimension D2 of the second electrode section 51b (D1>D3>D2), for example. The vertical electrode 51 has a plurality of steps (steps sda and sdb) in the thickness direction of the semiconductor substrate 11. A variation in dimension from the first electrode section 51a (dimension D1) to the third electrode section 51c (dimension D3) results in formation of the step sda and a variation in dimension from the third electrode section 51c (dimension D3) to the second electrode section 51b (dimension D2) results in formation of the step sdb. The step sda is provided between the distal end of the first electrode section 51a and a distal end of the third electrode section 51c and the step sdb is provided between the distal end of the third electrode section 51c and the distal end of the second electrode section 51b. The third electrode section 51c is provided between the first electrode section 51a and the second electrode section 51b in such a manner, which makes adjustment of the modulation volume easier. Two or more electrode sections different in dimension from each other may be provided between the first electrode section 51a and the second electrode section 51b.

Third Embodiment

FIG. 29A and FIG. 29B each schematically illustrate a configuration of a relevant portion of an imaging device (imaging device 3) according to a third embodiment of the present disclosure. FIG. 29A illustrates a planar configuration of a relevant portion of each of the pixels P of the imaging device 3 and FIG. 29B illustrates a cross-sectional configuration taken along a B-B' line seen in FIG. 29A. FIG. 29B corresponds to FIG. 4 illustrating the imaging device 1 of the above-described first embodiment. The transfer gate TG of this imaging device 3 includes a first vertical electrode 51A and a second vertical electrode 51B separated from each other. Except for this, the imaging device 3 has a configuration similar to that of the imaging device 1 according to the above-described first embodiment and workings and effects thereof are also similar.

The first vertical electrode 51A and the second vertical electrode 51B are provided in this sequence along the signal charge transfer path from the PD 41 to the FD 42. The first vertical electrode 51A is provided adjacent to the PD 41 in the signal charge transfer path from the PD 41 to the FD 42, for example. Here, this first vertical electrode 51A includes the first electrode section 51a and the first vertical electrode 51A has the dimension D1 in the thickness direction of the semiconductor substrate 11. The second vertical electrode 51B is provided adjacent to the FD 42 in the signal charge transfer path from the PD 41 to the FD 42, for example. The gate insulating film 53 is provided between the second vertical electrode 51B and the first vertical electrode 51A, and the first vertical electrode 51A and the second vertical electrode 51B are separated from each other, for example. Here, the second vertical electrode 51B includes the second electrode section 51b and the second vertical electrode 51B has the dimension D2 in the thickness direction of the semiconductor substrate 11. A variation in dimension from the first vertical electrode 51A (dimension D1) to the second vertical electrode 51B (dimension D2) results in formation of the step sd in the thickness direction of the semiconductor substrate 11 between the first vertical electrode 51A and the second vertical electrode 51B.

The above-described modification examples 1 to 4 are also applicable to the imaging device 3.

For example, as illustrated in FIG. 30, a distal end of each of the first vertical electrode 51A and the second vertical electrode 51B may have a rounded corner portion CP. Alternatively, a thickness of a portion of the gate insulating film 53 may be larger than a thickness of the other portion of the gate insulating film 53 (see FIG. 17) and the vertical electrode 51 may have a planar shape other than a circular shape (see FIG. 18, FIG. 20, and FIG. 21). Moreover, the planar electrode 52 may have a planar shape other than a square shape and a rectangular shape (see FIG. 22).

Next, a formation method of the first vertical electrode 51A and the second vertical electrode 51B will be described with reference to (A) and (B) of FIG. 31 to (A) and (B) of FIG. 34. (A) of FIG. 31 to (A) of FIG. 34 each illustrate a planar (XY-planar) configuration on the front surface 11Sa side of the semiconductor substrate 11 and (B) of FIG. 31 to (B) of FIG. 34 each illustrate a cross-sectional configuration corresponding to FIG. 23B.

First, as illustrated in (A) and (B) of FIG. 31, the resist film 21 having the opening 21M is formed on the front surface 11Sa of the semiconductor substrate 11. The opening 21M has a circular planar shape, for example. The opening 21M is formed at a position overlapping a region where the first vertical electrode 51A is to be formed in a plan view. The opening 21M is formed by photolithography, for example.

Next, as illustrated in (A) and (B) of FIG. 32, the semiconductor substrate 11 is dry-etched through the opening 21M of this resist film 21. By doing so, the groove 11VA is formed on a portion of the semiconductor substrate 11 corresponding to the opening 21M.

Subsequently, as illustrated in (A) and (B) of FIG. 33, an opening 21MB is formed at a position spaced from the opening 21M. The opening 21MB has a circular planar shape, for example. The opening 21MB is formed at a position overlapping a region where the second vertical electrode 51B is to be formed in a plan view. The opening 21MB is formed by photolithography, for example.

Next, as illustrated in (A) and (B) of FIG. 34, the semiconductor substrate 11 is dry-etched through the openings 21M and 21MB of this resist film 21. By doing so, a groove 11VB is formed on a portion of the semiconductor substrate 11 corresponding to the opening 21MB, and the groove 11VA is made deeper. Subsequently, an insulating material and an electrically conductive material are embedded in this sequence in these grooves 11VA and 11VB. By doing so, the gate insulating film 53 and the first vertical electrode 51A are formed in the groove 11VA, and the gate insulating film 53 and the second vertical electrode 51B are formed in the groove 11VB.

The imaging device 3 according to the present embodiment includes the transfer gate TG including the first vertical electrode 51A and the second vertical electrode 51B smaller in dimension in the thickness direction of the semiconductor substrate 11 than the first vertical electrode 51A. This makes it possible to reduce signal charges remaining in the transfer path while maintaining the desired modulation volume. It is thus possible to suppress a decrease in image quality. Furthermore, it is possible to form the first vertical electrode 51A and the second vertical electrode 51B by simple lithography and a simple etching process, which makes a production process easier as compared with that of the vertical electrode 51 described in the above-described first embodiment.

Modification Example 6

FIG. 35A and FIG. 35B each schematically illustrate a configuration of a relevant portion of the imaging device 3 according to a modification example 6 of the above-described third embodiment. FIG. 35A illustrates a planar configuration of each of the pixels P of the imaging device 3, and corresponds to FIG. 29A of the above-described third embodiment. FIG. 35B illustrates a cross-sectional configuration taken along a line B-B' seen in FIG. 35A, and corresponds to FIG. 29B of the above-described third embodiment. In this imaging device 3, the transfer gate TG includes a third vertical electrode 51C between the first vertical electrode 51A and the second vertical electrode 51B. Except for this, the imaging device 3 according to the modification example 6 has a configuration similar to that of the imaging device 3 according to the above-described third embodiment, and workings and effects thereof are also similar.

The third vertical electrode 51C is provided between the first vertical electrode 51A and the second vertical electrode 51B in the signal charge transfer path from the PD 41 to the FD 42, for example. The third vertical electrode 51C has the dimension D3 in the thickness direction of the semiconductor substrate 11. This dimension D3 is smaller than the dimension D1 of the first vertical electrode 51A and larger than the dimension D2 of the second vertical electrode 51B (D1>D3>D2), for example. The step sda is formed by a variation in dimension from the first vertical electrode 51A (dimension D1) to the third vertical electrode 51C (dimension D3) and the step sdb is formed by a variation in dimension from the third vertical electrode 51C (dimension D3) to the second vertical electrode 51B (dimension D2). Providing such a third vertical electrode 51C between the first vertical electrode 51A and the second vertical electrode 51B makes adjustment of the modulation volume easier. Two or more vertical electrodes different in dimension from each other may be provided separately from each other between the first vertical electrode 51A and the second vertical electrode 51B.

Modification Example 7

FIG. 36A and FIG. 36B each schematically illustrate a configuration of a relevant portion of the imaging device 3 according to a modification example 7 of the above-described third embodiment. FIG. 36A illustrates a planar configuration of each of the pixels P of the imaging device 3, and corresponds to FIG. 29A of the above-described third embodiment. FIG. 36B illustrates a cross-sectional configuration taken along a line B-B' seen in FIG. 36A, and corresponds to FIG. 29B of the above-described third embodiment. Here, the transfer gate TG includes the first planar electrode 52A and the second planar electrode 52B. Except for this, the imaging device 3 according to the modification example 7 has a configuration similar to that of the imaging device 3 according to the above-described third embodiment, and workings and effects thereof are also similar.

The first planar electrode 52A and the second planar electrode 52B are provided on the front surface 11Sa of the semiconductor substrate 11 and both have a rectangular planar shape, for example. For example, the first planar electrode 52A and the second planar electrode 52B are provided in this sequence along the signal charge transfer path from the PD 41 to the FD 42. The first planar electrode 52A and the second planar electrode 52B are electrically separated from each other. For example, the first vertical electrode 51A is coupled to the first planar electrode 52A and the second vertical electrode 51B is coupled to the second planar electrode 52B. The first planar electrode 52A and the second planar electrode 52B electrically separated from each other are provided in such a manner, which makes it possible to change a value of voltage to be applied to each of the first planar electrode 52A and the second planar electrode 52B. This makes it possible to improve signal charge transfer efficiency from the PD 41 to the FD 42.

Modification Example 8

FIG. 37A and FIG. 37B each schematically illustrate a configuration of a relevant portion of the imaging device 3 according to a modification example 8 of the above-described third embodiment. FIG. 37A illustrates a planar configuration of each of the pixels P of the imaging device 3, and corresponds to FIG. 29A of the above-described third embodiment. FIG. 37B illustrates a cross-sectional configuration taken along a line B-B' seen in FIG. 37A, and corresponds to FIG. 29B of the above-described third embodiment. Here, the transfer gate TG includes four vertical electrodes (two first vertical electrodes 51A and two second vertical electrodes 51B). Except for this, the imaging device 3 according to the modification example 8 has a configuration similar to that of the imaging device 3 according to the above-described third embodiment, and workings and effects thereof are also similar.

As described in the above-described third embodiment, the first vertical electrodes 51A and the second vertical electrodes 51B are provided in this sequence along the signal charge transfer path from the PD 41 to the FD 42. The two first vertical electrodes 51A are provided side by side in a direction intersecting the signal charge transfer path such as a direction perpendicular to the signal charge transfer path and the two second vertical electrodes 51B are provided side by side in the direction intersecting the signal charge transfer path. That is, in this transfer gate TG, two pairs of first vertical electrodes 51A and second vertical electrodes 51B are provided side by side in the direction intersecting the signal charge transfer path. In such a transfer gate TG, a signal charge is transferred to the FD 42 through between the two first vertical electrodes 51A and between the two second vertical electrodes 51B. Consequently, as compared with a case where only the single pair of first vertical electrode 51A and second vertical electrode 51B is provided (FIG. 29A and FIG. 29B), the signal charge transfer path is shortened, and probability of signal charge trapping in the transfer path is lowered. This makes it possible to improve signal charge transfer efficiency from the PD 41 to the FD 42 and, consequently, improve image quality.

Modification Example 9

FIG. 38 schematically illustrates a configuration of a relevant portion of each of the imaging devices 1, 2 and 3 according to a modification example 9 of the above-described first to third embodiments. FIG. 38 illustrates a planar configuration of each of the pixels P of the imaging devices 1, 2, and 3, and corresponds to FIG. 2 of the above-described first embodiment. Here, a global shutter system is applied to the imaging devices 1, 2, and 3. Except for this, the imaging devices 1, 2, and 3 according to the modification example 9 respectively have configurations similar to those of the imaging devices 1, 2, and 3 according to the above-described first to third embodiments, and workings and effects thereof are also similar.

The global shutter system is a system in which, basically, exposure of all the pixels to light simultaneously starts and the exposure of all the pixels to light simultaneously ends. Here, all the pixels refer to all pixels in a portion appearing in an image, excluding a dummy pixel, etc. Moreover, in a case where a time difference and distortion of an image are insignificantly small, the global shutter system includes a system in which global exposure is performed per unit of a plurality of rows (e.g., several ten rows) instead of being simultaneously performed on all the pixels, while shifting a region to be subjected to the global exposure. In addition, the global shutter system also includes a system in which the global exposure is performed on not all pixels in the portion appearing in the image but on pixels in a predetermined region.

The pixels P each include the PD 41, transfer transistors TR and TR2, a memory (MEM) 43, and the FD 42. In each of the pixels P, the transfer transistor TR is provided between the PD 41 and the MEM 43 and the transfer transistor TR2 is provided between the MEM 43 and the FD 42. The FD 42 is coupled to the vertical signal line Lsig through the amplification transistor AMP and the selection transistor SEL (see FIG. 2 and FIG. 3). Here, the transfer gate TG of the transfer transistor TR corresponds to a specific example of a "first transfer gate" in the present disclosure and a transfer gate TG2 of the transfer transistor TR corresponds to a specific example of a "second transfer gate" in the present disclosure. Moreover, the MEM 43 corresponds to a specific example of the "first charge accumulator" in the present disclosure and the FD 42 corresponds to a specific example of a "second charge accumulator" in the present disclosure.

For example, one of a pair of source•drain electrodes of the transfer transistor TR is coupled to the PD 41 and the other one is coupled to the MEM 43. The transfer transistor TR is turned on in response to input of a drive signal to the gate thereof. This causes the signal charge generated by the PD 41 to be read and transferred to the MEM 43.

The MEM 43 is coupled to the transfer transistor TR and the transfer transistor TR2. This MEM 43 is a charge storage for temporarily holding the signal charge generated by the PD 41. Each of the imaging devices 1, 2, and 3 according to the present modification example includes this MEM 43, thereby implementing a global shutter function.

One of a pair of source•drain electrodes of the transfer transistor TR2 is coupled to the MEM 43 and the other one is coupled to the FD 42. The transfer transistor TR2 is turned on in response to input of a drive signal to the gate thereof. This causes the signal charge temporarily held in the MEM 43 to be read and transferred to the FD 42.

The present disclosure is also applicable to such global-shutter system imaging devices 1, 2, and 3. For example, the transfer gate TG of the transfer transistor TR may include the first electrode section 51a (or the first vertical electrode 51A) and the second electrode section 51b (or the second vertical electrode 51B), and the first electrode section 51a and the second electrode section 51b may be provided in this sequence along a signal charge transfer path from the PD 41 to the MEM 43 (see FIG. 4, etc.). Alternatively, the transfer gate TG2 of the transfer transistor TR2 may include the first electrode section 51*a* (or the first vertical electrode 51A) and the second electrode section 51*b* (or the second vertical electrode 51B), and the first electrode section 51*a* and the second electrode section 51*b* may be provided in this sequence along a signal charge transfer path from the MEM 43 to the FD 42 (see FIG. 4, etc.). The transfer gates TG and TG2 of the transfer transistors TR and TR2 may each include the first electrode section 51*a* (or the first vertical electrode 51A) and the second electrode section 51*b* (or the second vertical electrode 51B).

In addition, the imaging devices 1, 2, and 3 are each applicable to a so-called vertically stacked global shutter system imaging device.

FIG. 39A and FIG. 39B each illustrate another example of the imaging devices 1, 2, and 3 illustrated in FIG. 38. Each of these imaging devices 1, 2, and 3 is the so-called vertically stacked global shutter system imaging device. FIG. 39A illustrates a planar configuration of a relevant portion of each of the pixels P of the imaging devices 1, 2, and 3 and FIG. 39B illustrates a cross-sectional configuration taken along a B-B' line seen in FIG. 39A. As illustrated, a portion of the MEM 43 may be stacked on the PD 41. This makes an increase in an area of the PD 41 easy.

The present disclosure is also applicable to such vertically stacked global shutter system imaging devices 1, 2, and 3. For example, the transfer gate TG of the transfer transistor TR may include the first electrode section 51*a* (or the first vertical electrode 51A) and the second electrode section 51*b* (or the second vertical electrode 51B), and the first electrode section 51*a* and the second electrode section 51*b* may be provided in this sequence along the signal charge transfer path from the PD 41 to the MEM 43 (FIG. 39B). Alternatively, the transfer gate TG2 of the transfer transistor TR2 may include the first electrode section 51*a* (or the first vertical electrode 51A) and the second electrode section 51*b* (or the second vertical electrode 51B), and the first electrode section 51*a* and the second electrode section 51*b* may be provided in this sequence along the signal charge transfer path from the MEM 43 to the FD 42 (see FIG. 4, etc.). The transfer transistors TR and TR2 may each include the first electrode section 51*a* (or the first vertical electrode 51A) and the second electrode section 51*b* (or the second vertical electrode 51B).

Modification Example 10

FIG. 40 schematically illustrates a planar configuration of a relevant portion of each of the imaging devices 1, 2, and 3 according to a modification example 10 of the above-described first to third embodiments. FIG. 40 corresponds to FIG. 2 of the above-described first embodiment. Here, the FD 42 is shared by a plurality of PDs 41. Except for this, the imaging devices 1, 2, and 3 according to the modification example 10 respectively have configurations similar to those of the imaging devices 1, 2 and 3 according to the above-described first to third embodiments, and workings and effects thereof are also similar.

FIG. 41 illustrates an example of an equivalent circuit of each of the imaging devices 1, 2, and 3 illustrated in FIG. 40. For example, in each of the imaging devices 1, 2, and 3, signal charges are transferred from four PDs 41 to the single FD 42. That is, the four PDs 41 share the FD 42. Although not illustrated, two PDs 41 may share the FD 42. Alternatively, eight PDs 41 may share the FD 42. The number of the PDs 41 that share the FD 42 may be different from the above. The FD 42 is shared by the plurality of PDs 41 as above, thereby making it possible to improve flexibility in designing a pixel layout.

It is to be noted that conductivity types may be inverted in the first to third embodiments and the modification examples 1 to 10 thereof described above. For example, in the first to third embodiments and the modification examples 1 to 9 thereof described above, the p-type may be replaced with the n-type while the n-type may be replaced with the p-type. Even in such a case, effects similar to those of the first to third embodiments and the modification examples 1 to 9 described above are achievable.

Application Example

FIG. 42 illustrates an example of a schematic configuration of an imaging system 7 including any of the imaging devices 1, 2, and 3 (hereinafter, collectively referred to as imaging device 1) according to the first to third embodiments and the modification examples 1 to 9 thereof described above.

For example, the imaging system 7 is an electronic apparatus. Examples of the electronic apparatus include an imaging apparatus such as a digital still camera and a video camera, and a mobile terminal such as a smartphone and a tablet terminal. For example, the imaging system 7 includes an optical system 241, a shutter apparatus 242, the imaging device 1, a DSP circuit 243, a frame memory 244, a display section 245, a storage section 246, an operation section 247, and a power source section 248. In the imaging system 7, the shutter apparatus 242, the imaging device 1, the DSP circuit 243, the frame memory 244, the display section 245, the storage section 246, the operation section 247, and the power source section 248 are coupled to one another through a bus line 249.

The imaging device 1 outputs image data corresponding to incoming light. The optical system 241 includes one or a plurality of lenses, and guides light (incoming light) from an object to the imaging device 1 to form an image on a light-receiving surface of the imaging device 1. The shutter apparatus 242 is provided between the optical system 241 and the imaging device 1, and controls a period in which the imaging device 1 is irradiated with light and a period in which the light is blocked in accordance with control by the operation section 247. The DSP circuit 243 is a signal processing circuit that processes a signal (image data) outputted from the imaging device 1. The frame memory 244 temporarily holds the image data processed by the DSP circuit 243 per unit of frame. The display section 245 includes, for example, a panel display such as a liquid crystal panel or an organic electroluminescence (EL) panel, and displays a moving image or a still image captured by the imaging device 1. The storage section 246 records the image data of the moving image or the still image captured by the imaging device 1 in a recording medium such as a semiconductor memory or a hard disk. The operation section 247 outputs an operation command regarding a variety of functions of the imaging system 7 in accordance with an operation by a user. The power source section 248 supplies a variety of power sources serving as operation power sources for the imaging device 1, the DSP circuit 243, the frame memory 244, the display section 245, the storage section 246, and the operation section 247, to these supply targets as necessary.

Next, an imaging procedure in the imaging system 7 will be described below.

FIG. 43 illustrates an example of a flowchart of an imaging operation in the imaging system 7. A user gives an instruction for start of imaging by operating the operation section 247 (step S101). In response to this, the operation section 247 transmits an imaging command to the imaging device 1 (step S102). The imaging device 1 (specifically, a system control circuit 36) receives the imaging command, and then executes imaging by a predetermined imaging system (step S103).

The imaging device 1 outputs, to the DSP circuit 243, an image of light (image data) formed on the light-receiving surface through the optical system 241 and the shutter apparatus 242. Here, the image data refers to data for all the pixels of pixel signals generated on the basis of charges temporarily held in the FD 42. The DSP circuit 243 performs predetermined signal processing (e.g., noise reduction, etc.) on the basis of the image data received from the imaging device 1 (step S104). The DSP circuit 243 causes the frame memory 244 to hold the image data having been subjected to the predetermined signal processing, and the frame memory 244 causes the storage section 246 to store the image data (step S105). The image is thus captured by the imaging system 7.

In the present application example, the imaging device 1 is applied to the imaging system 7. This makes it possible to suppress a decrease in image quality of the imaging device 1 and, consequently, provide the high-quality imaging system 7.

Practical Application Example

Practical Application Example 1

A technology according to the present disclosure (the present technology) is applicable to a variety of products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 44 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 44, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 44, an audio speaker 12061, a display section 12062, and an instrument panel 12063 are illustrated as the output device. The display section 12062 may, for example, include at least one of an on-board display and a head-up display.

FIG. 45 is a diagram depicting an example of the installation position of the imaging section 12031.

In FIG. 45, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 45 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of an example of the mobile body control system to which the technology according to the present disclosure is applicable. The technology according to the present disclosure is applicable to the imaging section 12031 in the configuration described above. Specifically, the imaging device 1 according to any of the embodiments and the modification examples thereof described above is applicable to the imaging section 12031. The application of the technology according to the present disclosure to the imaging section 12031 makes it possible to obtain a high-definition captured image with less noise and, consequently, achieve highly accurate control using the captured image by the mobile body control system.

Practical Application Example 2

FIG. 46 is a view depicting an example of a schematic configuration of an endoscopic surgery system to which the technology according to an embodiment of the present disclosure (present technology) can be applied.

In FIG. 46, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 47 is a block diagram depicting an example of a functional configuration of the camera head 11102 and the CCU 11201 depicted in FIG. 46.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of an example of the endoscopic surgery system to which the technology according to the present disclosure is applicable. The technology according to the present disclosure is suitably applicable to the image pickup unit 11402 provided in the camera head 11102 of the endoscope 11100 in the configuration described above. The application of the technology according to the present disclosure to the image pickup unit 11402 makes it possible to suppress a decrease in image quality of the image pickup unit 11402 and, consequently, provide the high-quality endoscope 11100.

Although the present disclosure has been described above with reference to the first to third embodiments and the modification examples 1 to 9, the application example, and the practical application examples, the present disclosure is not limited to the above-described embodiments, etc., and may be modified in a variety of ways. For example, in the above-described embodiments, etc., a case where the plurality of pixel drive lines Lread extends in a row direction and the plurality of vertical signal lines Lsig extends in a column direction has been described as an example, but both the pixel drive lines Lread and the vertical signal lines Lsig may extend in the same direction. Moreover, an extending direction of the pixel drive lines Lread may be changed to a vertical direction or the like as necessary.

The effects described in the above-described embodiments, etc. are merely illustrative, and the effects of the present disclosure may be other effects, or may further include other effects.

It is to be noted that the present disclosure may include the following configurations. A solid-state imaging device having any of the following configurations and an electronic apparatus including the solid-state imaging device each include the first transfer gate including the first electrode section and the second electrode section having the dimension in the thickness direction of the semiconductor substrate smaller than that of the first electrode section, which makes it possible to reduce signal charges remaining in the transfer path while maintaining the predetermined modulation volume. This makes it possible to suppress a decrease in image quality.

(1)

A solid-state imaging device including:

a semiconductor substrate;

a photoelectric converter having a predetermined dimension in a thickness direction of the semiconductor substrate;

a first charge accumulator that is provided in the semiconductor substrate and accumulates a signal charge generated by the photoelectric converter; and a transfer gate including a first electrode section and a second electrode section, the first electrode section being embedded in the semiconductor substrate, having a first dimension in the thickness direction of the semiconductor substrate, and being provided on a side of the photoelectric converter, and the second electrode section being selectively provided at a position closer to the first charge accumulator than the first electrode section and having a second dimension in the thickness direction of the semiconductor substrate smaller than the first dimension.

(2)

The solid-state imaging device according to (1), in which the transfer gate includes a vertical electrode and a planar electrode, the vertical electrode including the first electrode section and the second electrode section, and the planar electrode being provided on a front surface of the semiconductor substrate and coupled to the vertical electrode.

(3)

The solid-state imaging device according to (2), in which the first electrode section is provided adjacent to the photoelectric converter and the second electrode section is provided adjacent to the first charge accumulator, and a dimension of the vertical electrode in the thickness direction of the semiconductor substrate includes the first dimension as a maximum and the second dimension as a minimum.

(4)

The solid-state imaging device according to (2) or (3), in which a dimension of the vertical electrode in the thickness direction of the semiconductor substrate is reduced gradually or stepwise from the photoelectric converter toward the first charge accumulator.

(5)

The solid-state imaging device according to any one of (2) to (4), in which the vertical electrode has a slanted surface that couples the first electrode section and the second electrode section to each other.

(6)

The solid-state imaging device according to any one of (2) to (4), in which the vertical electrode has at least one step in the thickness direction of the semiconductor substrate between the first electrode section and the second electrode section.

(7)

The solid-state imaging device according to (2) or (3), in which the vertical electrode includes a first vertical electrode and a second vertical electrode, the first vertical electrode including the first electrode section, and the second vertical electrode including the second electrode section and being provided separately from the first vertical electrode.

(8)

The solid-state imaging device according to (7), in which the vertical electrode further includes a third vertical electrode between the first vertical electrode and the second vertical electrode, the third vertical electrode having a dimension in the thickness direction of the semiconductor substrate smaller than the first dimension and larger than the second dimension.

(9)

The solid-state imaging device according to (7) or (8), in which the planar electrode includes a first planar electrode and a second planar electrode, the first planar electrode being coupled to the first vertical electrode, and the second planar electrode being coupled to the second vertical electrode and electrically separated from the first planar electrode.

(10)

The solid-state imaging device according to any one of (2) to (9), in which a distal end of the vertical electrode has a rounded corner portion.

(11)

The solid-state imaging device according to any one of (2) to (10), further including a gate insulating film provided between the semiconductor substrate and the transfer gate.

(12)

The solid-state imaging device according to (11), in which a thickness of a portion of the gate insulating film provided between the vertical electrode and the semiconductor substrate is larger than a thickness of another portion of the gate insulating film.

(13)

The solid-state imaging device according to (12), in which the portion is provided in a vicinity of a distal end of the vertical electrode.

(14)

The solid-state imaging device according to any one of (2) to (13), in which the vertical electrode has a planar shape tapered from the photoelectric converter toward the first charge accumulator.

(15)

The solid-state imaging device according to any one of (2) to (14), in which the planar electrode has a planar shape tapered from the photoelectric converter toward the first charge accumulator.

(16)

The solid-state imaging device according to any one of (2) to (15), in which the transfer gate includes a plurality of the vertical electrodes provided side by side in a direction intersecting a transfer path of the signal charge from the photoelectric converter to the first charge accumulator.

(17)

The solid-state imaging device according to any one of (1) to (16), further including a second charge accumulator to which the signal charge is transferred from the first charge accumulator, in which
the transfer gate includes at least one of a first transfer gate or a second transfer gate, the first transfer gate transferring the signal charge from the photoelectric converter to the first charge accumulator, and the second transfer gate transferring the signal charge from the first charge accumulator to the second charge accumulator.

(18)

The solid-state imaging device according to any one of (1) to (17), in which the signal charge is transferred from each of a plurality of the photoelectric converters to the single first charge accumulator.

(19)

An electronic apparatus provided with a solid-state imaging device, the solid-state imaging device including:
a semiconductor substrate;
a photoelectric converter having a predetermined dimension in a thickness direction of the semiconductor substrate;
a first charge accumulator that is provided in the semiconductor substrate and accumulates a signal charge generated by the photoelectric converter; and
a transfer gate including a first electrode section and a second electrode section, the first electrode section being embedded in the semiconductor substrate, having a first dimension in the thickness direction of the semiconductor substrate, and being provided on a side of the photoelectric converter, and the second electrode section being selectively provided at a position closer to the first charge accumulator than the first electrode section and having a second dimension in the thickness direction of the semiconductor substrate smaller than the first dimension.

(20)

An imaging device, comprising:
a semiconductor substrate;
a photoelectric conversion element in the semiconductor substrate;
a transfer transistor, wherein the transfer transistor includes a transfer gate; and
a charge accumulator in the semiconductor substrate,
wherein the transfer gate includes a vertical electrode that extends in a depth direction from a first surface of the semiconductor substrate,
wherein the vertical electrode includes first electrode section embedded in the semiconductor substrate on a photoelectric conversion element side of the vertical electrode,
wherein the transfer gate includes a second electrode section embedded in the semiconductor substrate on a charge accumulator side of the vertical electrode,
wherein a distal end of the first electrode section extends to a first distance from a first surface of the semiconductor substrate,
wherein a distal end of the second electrode section extends to a second distance from the first surface of the semiconductor substrate, and
wherein the first distance is greater than the second distance.

(21)

The imaging device according to (20), wherein the transfer gate further includes a planar electrode on the first surface of the semiconductor substrate, and wherein the first and second electrode sections are joined to the planar electrode.

(22)

The imaging device according to (20) or (21), wherein the first electrode section is joined to the second electrode section, forming a unitary vertical electrode, and wherein in a cross section taken along a plane parallel to a plane of the first surface of the semiconductor substrate the vertical electrode has a circular shape.

(23)

The imaging device according to any of (20) to (22), wherein the distal ends of the first and second electrode sections form a slanted surface.

(24)

The imaging device according to (23), wherein the distal end of the first electrode section further includes a rounded corner portion.

(25)

The imaging device according to any of (20) to (24), further comprising:
a gate insulating film, wherein the gate insulating film is disposed between the vertical electrode and the semiconductor substrate.

(26)

The imaging device according to any of (20) to (24), further comprising:
a gate insulating film, wherein the gate insulating film is disposed between the vertical electrode and the semiconductor substrate, and wherein a thickness of the gate insulating film is greatest adjacent the deepest point of the distal end of the first electrode section.

(27)

The imaging device according to any of (20) to (26), wherein the first electrode section is joined to the second electrode section, forming a unitary vertical electrode, and wherein in a cross section taken along a plane parallel to a plane of the first surface of the semiconductor substrate the vertical electrode has a shape that is tapered from a wide portion adjacent the photoelectric conversion element to a narrow portion adjacent the charge accumulator.

(28)

The imaging device according to any of (20) to (26), wherein the first electrode section is joined to the second electrode section, forming a unitary vertical electrode, and wherein in a cross section taken along a plane parallel to a plane of the first surface of the semiconductor substrate the vertical electrode has a triangular shape.

(29)

The imaging device according to any of (20) to (26), wherein the first electrode section is joined to the second electrode section, forming a unitary vertical electrode, and wherein in a cross section taken along a plane parallel to a plane of the first surface of the semiconductor substrate the vertical electrode has a semicircular shape.

(30)

The imaging device according to (29), wherein a rounded portion of the semicircular shape is facing the charge accumulator.

(31)

The imaging device according to any of (20) to (26), wherein the first electrode section is joined to the second electrode section, forming a unitary vertical electrode, and wherein in a cross section taken along a plane parallel to a plane of the first surface of the semiconductor substrate the vertical electrode has a polygonal shape.

(32)

The imaging device according to (31), wherein the planar electrode is tapered from a wide portion adjacent the photoelectric conversion element to a narrow portion adjacent the charge accumulator.

(33)

The imaging device according to any of claims (20) to (22) or (25) to (32), wherein the distal end of the first electrode section has a surface that is parallel to the first surface of the semiconductor substrate, and wherein the distal end of the second electrode section has a surface that is parallel to the first surface of the semiconductor substrate.

(34)

The imaging device according to (33), wherein the first electrode section is joined to the second electrode section, forming a unitary vertical electrode, and wherein in at least a first cross section taken along a plane parallel to a plane of the first surface of the semiconductor substrate proximate to the planar electrode the vertical electrode has a circular shape.

(35)

The imaging device according to any of (20) to (34), wherein the vertical electrode further includes a third electrode section embedded in the semiconductor substrate, wherein the distal end of the third electrode section is a third distance from the first surface of the semiconductor surface, and wherein the third distance is greater than the second distance and less than the first distance.

(36)

The imaging device according to (35), wherein the first electrode section, the second electrode section, and the third electrode section are spaced apart from one another.

(37)

The imaging device according to (20), wherein the transfer gate further includes a planar electrode having a first planar section and a second planar section, wherein the first planar electrode is spaced apart from the second planar electrode section, wherein the first electrode section extends from the first planar section, and wherein the second electrode section extends from the second planar section.

(38)

The imaging device according to (37), wherein a width of the distal portion of the first electrode section is less than a width of the first electrode section at the first planar section, and wherein a width of the distal portion of the second electrode section is less than a width of the second electrode section at the second planar section.

(39)

An electronic apparatus, comprising:
an optical system;
an imaging device, wherein the optical system forms an image on the imaging device, the imaging device including:
a semiconductor substrate;
a photoelectric conversion element in the semiconductor substrate;
a transfer transistor, wherein the transfer transistor includes a transfer gate; and
a charge accumulator in the semiconductor substrate,
wherein the transfer gate includes a vertical electrode that extends in a depth direction from a first surface of the semiconductor substrate,
wherein the vertical electrode includes first electrode section embedded in the semiconductor substrate on a photoelectric conversion element side of the vertical electrode,
wherein the transfer gate includes a second electrode section embedded in the semiconductor substrate on a charge accumulator side of the vertical electrode,
wherein a distal end of the first electrode section extends to a first distance from a first surface of the semiconductor substrate,
wherein a distal end of the second electrode section extends to a second distance from the first surface of the semiconductor substrate, and
wherein the first distance is greater than the second distance; and
a processor, wherein the processor processes image data output from the imaging device.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 2, 3: imaging device
7: imaging system
10P: light-receiving region
10B: peripheral region
11: semiconductor substrate
11Sa: front surface
11Sb: back surface
41: PD
42: FD
43: MEM
51: vertical electrode
51A: first vertical electrode
51B: second vertical electrode
51C: third vertical electrode
51a: first electrode section
51b: second electrode section
51c: third electrode section
52: planar electrode
52A: first planar electrode
52B: second planar electrode
53: gate insulating film
TR, TR2: transfer transistor
RST: reset transistor
AMP: amplification transistor
SEL: selection transistor
P: pixel
D1, D2, D3: dimension

What is claimed is:

1. A light detecting device, comprising:
   a semiconductor substrate;
   a photoelectric conversion element in the semiconductor substrate;
   a transfer transistor, wherein the transfer transistor includes a transfer gate; and
   a charge accumulator in the semiconductor substrate,
   wherein the transfer gate includes a vertical electrode that extends in a depth direction from a first surface of the semiconductor substrate,
   wherein the vertical electrode includes a first electrode section embedded in the semiconductor substrate,
   wherein the transfer gate includes a second electrode section embedded in the semiconductor substrate,
   wherein a distal end of the first electrode section extends to a first distance from a first surface of the semiconductor substrate,
   wherein a distal end of the second electrode section extends to a second distance from the first surface of the semiconductor substrate,
   wherein the first distance is greater than the second distance,
   wherein in a horizonal view, the vertical electrode has a circular shape, and
   wherein the distal end of the first electrode section and the distal end of the second electrode section form a slant with respect to the first surface of the semiconductor substrate.

2. The light detecting device according to claim 1, wherein the transfer gate further includes a planar electrode on the first surface of the semiconductor substrate, and wherein the first and second electrode sections are joined to the planar electrode.

3. The light detecting device according to claim 2, wherein the first electrode section is joined to the second electrode section.

4. The light detecting device according to claim 1, wherein the distal end of the first electrode section further includes a rounded corner portion.

5. The light detecting device according to claim 1, further comprising:
   a gate insulating film, wherein the gate insulating film is disposed between the vertical electrode and the semiconductor substrate.

6. The light detecting device according to claim 2, wherein the planar electrode is tapered from a wide portion adjacent the photoelectric conversion element to a narrow portion adjacent the charge accumulator.

7. The light detecting device according to claim 2, wherein the distal end of the first electrode section has a surface that is parallel to the first surface of the semiconductor substrate, and wherein the distal end of the second electrode section has a surface that is parallel to the first surface of the semiconductor substrate.

8. The light detecting device according to claim 7, wherein the first electrode section is joined to the second electrode section.

9. The light detecting device according to claim 2, wherein the vertical electrode further includes a third electrode section embedded in the semiconductor substrate, and wherein the distal end of the third electrode section is a third distance from the first surface of the semiconductor surface.

10. The light detecting device according to claim 9, wherein the first electrode section, the second electrode section, and the third electrode section are spaced apart from one another.

11. The light detecting device according to claim 1, wherein the transfer gate further includes a planar electrode having a first planar section and a second planar section, wherein the first planar section is spaced apart from the second planar section, wherein the first electrode section extends from the first planar section, and wherein the second electrode section extends from the second planar section.

12. The light detecting device according to claim 6, wherein a width of the distal end of the first electrode section is less than a width of the first electrode section at the first planar section, and wherein a width of the distal end of the second electrode section is less than a width of the second electrode section at the second planar section.

13. A light detecting device, comprising:
    a semiconductor substrate;
    a photoelectric conversion element in the semiconductor substrate;
    a transfer transistor, wherein the transfer transistor includes a transfer gate;
    a charge accumulator in the semiconductor substrate,
    wherein the transfer gate includes a vertical electrode that extends in a depth direction from a first surface of the semiconductor substrate,
    wherein the vertical electrode includes a first electrode section embedded in the semiconductor substrate,
    wherein the transfer gate includes a second electrode section embedded in the semiconductor substrate,
    wherein a distal end of the first electrode section extends to a first distance from a first surface of the semiconductor substrate,
    wherein a distal end of the second electrode section extends to a second distance from the first surface of the semiconductor substrate,
    wherein the first distance is greater than the second distance,
    wherein in a horizonal view, the vertical electrode has a circular shape, and
    wherein the distal end of the first electrode section and the distal end of the second electrode section form a slant with respect to the first surface of the semiconductor substrate; and
    a gate insulating film,
    wherein the gate insulating film is disposed between the vertical electrode and the semiconductor substrate, and
    wherein a thickness of the gate insulating film is greatest adjacent a deepest point of the distal end of the first electrode section.

14. An electronic apparatus, comprising:
    an optical system;
    a light detecting device, wherein the optical system forms an image on the light detecting device, the light detecting device including:
       a semiconductor substrate;
       a photoelectric conversion element in the semiconductor substrate;
       a transfer transistor, wherein the transfer transistor includes a transfer gate; and
       a charge accumulator in the semiconductor substrate,
       wherein the transfer gate includes a vertical electrode that extends in a depth direction from a first surface of the semiconductor substrate,
       wherein the vertical electrode includes a first electrode section embedded in the semiconductor substrate,
       wherein the transfer gate includes a second electrode section embedded in the semiconductor substrate, wherein a distal end of the first electrode section extends to a first distance from a first surface of the semiconductor substrate, wherein a distal end of the second electrode section extends to a second distance from the first surface of the semiconductor substrate, wherein the first distance is greater than the second distance, wherein in a horizonal view, the vertical electrode has a circular shape, wherein the distal end of the first electrode section and the distal end of the second electrode section form a slant with respect to the first surface of the semiconductor substrate, wherein the vertical electrode further includes a third electrode section embedded in the semiconductor substrate, wherein the distal end of the third electrode section is a third distance from the first surface of the semiconductor surface, and wherein the first electrode section, the second electrode section, and the third electrode section are spaced apart from one another; and a processor, wherein the processor processes image data output from the light detecting device.

15. The electronic apparatus according to claim 14, wherein the transfer gate further includes a planar electrode on the first surface of the semiconductor substrate, and wherein the first and second electrode sections are joined to the planar electrode.

16. The electronic apparatus according to claim 14, wherein the first electrode section is joined to the second electrode section.

17. The electronic apparatus according to claim 14, wherein the distal ends of the first and second electrode sections form a slant with respect to the first surface of the semiconductor substrate.

18. The electronic apparatus according to claim 14, wherein the distal end of the first electrode section includes a rounded corner portion.

19. The electronic apparatus according to claim 14, further comprising:

a gate insulating film, wherein the gate insulating film is disposed between the vertical electrode and the semiconductor substrate.

* * * * *